United States Patent
Uchimura et al.

[19]

[11] Patent Number: 6,064,350
[45] Date of Patent: May 16, 2000

[54] LAMINATED APERTURE-FACED ANTENNA AND MULTI-LAYERED WIRING BOARD COMPRISING THE SAME

[75] Inventors: Hiroshi Uchimura; Takeshi Takenoshita, both of Kyoto, Japan

[73] Assignee: Kyocera Corporation, Kyoto, Japan

[21] Appl. No.: 09/122,547

[22] Filed: Jul. 24, 1998

[30] Foreign Application Priority Data

Jul. 25, 1997 [JP] Japan .................................. 9-200484
Feb. 23, 1998 [JP] Japan .................................. 10-040813

[51] Int. Cl.[7] .................................................. H01Q 13/00
[52] U.S. Cl. ................................ 343/786; 343/700 MS; 343/767; 343/742; 343/772
[58] Field of Search ........................ 343/786, 700 MS, 343/767, 741, 772, 742; H01Q 13/00

[56] References Cited

U.S. PATENT DOCUMENTS

| | | | |
|---|---|---|---|
| 4,827,276 | 5/1989 | Fukuzawa et al. | 343/778 |
| 5,657,033 | 8/1997 | Young | 343/786 |
| 5,714,964 | 2/1998 | Jackson | 343/786 |
| 5,726,667 | 3/1998 | Tamura | 343/786 |
| 5,737,698 | 4/1998 | Gabrelian et al. | 455/286 |

FOREIGN PATENT DOCUMENTS

| | | |
|---|---|---|
| 62-222702 | 9/1987 | Japan . |
| 63-098201 | 4/1988 | Japan . |

*Primary Examiner*—Don Wong
*Assistant Examiner*—Shih-Chao Chen
*Attorney, Agent, or Firm*—Loeb & Loeb, LLP

[57] ABSTRACT

There is provided a laminated aperture antenna in which a conductor wall composing the antenna is composed of a plurality of through conductors disposed at predetermined intervals and a plurality of sub-conductor layers disposed between dielectric layers of a dielectric substrate so as to electrically connect the plurality of through conductors within the dielectric substrate formed by laminating dielectric layers, or in which a resonant space is formed by a space of the dielectric surrounded by the conductor wall composing the antenna formed as described above, a lower conductor layer electrically connected to that and an aperture of the upper conductor layer corresponding to the antenna conductor wall. There is also provided a multi-layered wiring board comprising such laminated aperture antenna. Such laminated aperture antenna may be miniaturized and thinned and may be readily fabricated by the conventional lamination technology.

26 Claims, 24 Drawing Sheets

LAMINATED APERTURE-FACED ANTENNA AND MULTI-LAYERED WIRING BOARD COMPRISING THE SAME

BACKGROUND OF THE INVENTION

1. Field of the Invention

The present invention relates primarily to a laminated aperture antenna suitable to communications using high-frequency waves such as microwave and millimeter wave and to a multi-layered wiring board comprising such a laminated aperture antenna.

2. Description of the Related Art

Studies on mobile communications, inter-vehicular radars or the like using high-frequency waves such as microwave and millimeter wave are actively conducted lately in the technological field of telecommunication. Normally, input/output of high-frequency signals between equipments in such communication is conducted by means of antenna in the end. While various antennas for the use of high-frequency waves have been examined since the past, a slotted waveguide antenna, a microstrip antenna, an aperture antenna and the like have been known as typical ones.

Further, while these high-frequency antennas are used by being connected with a high-frequency electrical circuit, a waveguide is used for the aperture antenna and the slotted waveguide antenna and a triplate line is used mainly for the microstrip antenna as a feed line connecting the electrical circuit and the antenna.

A planar array antenna in which a plurality of radiating elements formed of a hole whose inner face is metallized are disposed and are connected each other by a waveguide having a hollow section has been also proposed in Japanese Unexamined Patent Publication JP-A-62-222702.

It is also desired, recently, to integrate the antenna with a package in which a high-frequency circuit and high-frequency elements are stored from the aspect of miniaturizing the communication system equipment including the high-frequency antenna.

The antenna itself must be light, thin and small in order to use the high-frequency antenna as described above for the mobile communications, the collision avoidance radars and the like.

Among the high-frequency antennas described above, while the slotted waveguide antenna has advantages that it is highly efficient and that it can be formed thin, it also has disadvantages that it cannot be applied to a wide band, that it is heavy because it is fabricated by working a metal sheet and that it is costly. In contrary to that, while the microstrip antenna has advantages that it is light and can be formed thin because it is fabricated by adhering a metallic film on a dielectric sheet and that it is less costly because it can be fabricated readily, it has disadvantages that its efficiency is low and that it cannot be used in a wide band.

Meanwhile, the aperture antenna, e.g. a horn antenna, has advantages that it can be applied to a wide band and that its performance is very excellent in terms of the antenna characteristics, it has disadvantages that its size is large, that it is difficult to mount on a communication terminal and that it is difficult to lighten because it is fabricated by working three-dimensionally by using metallic members.

While the planar array antenna as disclosed in JP-A-62-222702 has advantages that it is light because it uses plastics as a base member thereof and it can be applied to a wide band, it has disadvantages that its feed section is thick and that it is difficult to miniaturize and thin it because the waveguide is used for the feed line.

When the high-frequency wave to be applied falls in the domain of millimeter wave, the characteristic of the whole antenna system becomes important in case when either one of the above-mentioned high-frequency antenna is used. That is, because the whole system is constructed by connecting the high-frequency antenna, the feed line, the high-frequency circuit and others in the end, the whole antenna system is influenced also by the characteristic, size, cost and others of the part connecting them no matter how their individual characteristic is excellent. For example, when the connecting part thereof is constructed by waveguides, the antenna system may be constructed almost without impairing the performance of the high-frequency antenna, the feed line, the high-frequency circuit and the like. However, there arise problems when they are connected by the waveguide that its structure is liable to be three-dimensional and that it drops the reliability and increases the cost because they are connected mechanically by screws and the like.

While the planar array antenna disclosed in JP-A-62-222702 excels as an antenna itself in this aspect because the antenna section is molded in a body with the feed line, it has had problems that its connectivity with other components such as the high-frequency circuit is bad and that it is difficult to form them in a body.

SUMMARY OF THE INVENTION

Accordingly, it is an object of the present invention to provide a laminated aperture antenna which is applicable to a wide band, which can be miniaturized and which can be readily fabricated by the conventional lamination technology.

It is another object of the invention to provide a multi-layered wiring board which allows a high-frequency circuit to be formed and in which a feed line and the antenna are formed in a body.

The inventor has found, and devised the present invention, as a result of examination conducted on the above-mentioned problems, that a thin laminated aperture antenna may be readily fabricated and a feed line and a high-frequency circuit may be readily integrated by the conventional lamination technology by forming part or whole of a conductor wall composing an antenna by a plurality of through conductors disposed at predetermined intervals and a plurality of sub-conductor layers disposed between dielectric layers of a dielectric substrate so as to electrically connect the plurality of through conductors within the dielectric substrate formed by laminating dielectric layers, or by creating a quarter wavelength resonant space of one-side shorted and one-side opened by a space of the dielectric surrounded by a lower conductor layer electrically connected to them and an aperture of the upper conductor layers corresponding to the antenna conductor wall.

The invention provides a laminated aperture antenna comprising a main conductor layer formed by adhering on the surface of a dielectric substrate formed by laminating a plurality of dielectric layers and having an aperture of a predetermined size; an antenna conductor wall composed of a. plurality of groups of through conductors formed in the laminating direction around the aperture of the main conductor layer at predetermined intervals and a plurality of sub-conductor layers formed between the dielectric layers so as to electrically connect the plurality of groups of through conductors; and a feed line for feeding electricity.

Since the antenna conductor wall of the above-mentioned laminated aperture antenna according to the invention is formed by combining the through conductors formed based on the lamination technology with the sub-conductor layers disposed between the dielectric layers, the aperture antenna which is applicable to the wide band may be readily fabricated at low cost. That is, because it allows the antenna to be utilized within the designed frequency even if the size of the antenna thus fabricated deviates more or less, it can be designed readily and the precision of fabrication is relaxed, allowing the antenna to be fabricated at low cost as a result.

The laminated aperture antenna of the invention is characterized in that the feed lines are formed to the aperture from two directions which cross at right angles each other and a phase difference of electromagnetic waves fed from the respective feed lines is set at 90°.

According to the invention, circularly polarized wave may be generated by feeding electricity by connecting the feed lines to the aperture from the two directions crossing at right angles each other and by shifting the phase of electromagnetic waves fed from the respective feed lines by 90°.

In addition to the above-mentioned structure, the laminated aperture antenna of the invention is characterized in that at least part of the antenna conductor wall is formed so as to gradually expand toward the outer space, that a concave portion is formed within the aperture, that the concave portion is formed so as to gradually expand toward the outer space, that the plurality of through conductors are arrayed at intervals of a half of signal wavelength or less, that the feed line is composed of a laminated waveguide comprising a pair of feeding main conductor layers and feeding through conductors which are arrayed in two rows in the transmission direction at intervals of a half or less of wavelength of transmitted signal so as to electrically connect between the main conductor layers, that part of the main conductor layer forms a conductor wall of a hollow waveguide antenna, and that a plurality of antennas are disposed in array.

According to the invention, because the above-mentioned antenna may be formed by the conventional lamination technology, it allows the antenna to be integrated in the conventional multi-layered wiring board and the feed line to the antenna and the high-frequency circuit to be formed in the same time. Further, because the energy loss in the feed line may be suppressed low and the dielectric waveguide may be miniaturized as compared to the conventional waveguide in the same time by forming the feed line by a pair of main conductor layers and through conductors arrayed in two rows in the transmission direction at intervals of a half or less of a wavelength of transmission signal so as to electrically connect between the main conductor layers, the substrate itself may be thinned and miniaturized.

Further, a laminated aperture antenna of the invention is characterized in that a spatial resonator is formed by a space surrounded by an upper main conductor layer formed by adhering on the upper surface of a dielectric substrate formed by laminating a plurality of dielectric layers and having an aperture of a predetermined size; an antenna conductor wall composed of a plurality of through conductors formed in the laminating direction of the dielectric layers around the aperture of the upper main conductor layer at predetermined intervals in the dielectric substrate and a plurality of sub-conductor layers formed between the dielectric layers so as to electrically connect the plurality of through conductors; and a lower main conductor layer which is adhered and formed under the antenna conductor wall of the dielectric substrate at the position facing to the aperture and which is electrically connected with the antenna conductor wall. The space turns out to be a quarter wavelength spatial resonator whose one face is shorted and the other one face is opened.

Since the antenna conductor wall of the laminated aperture antenna according to the invention is formed by combining the through conductors which are formed in the dielectric substrate formed by laminating dielectric layers based on the lamination technology for a multi-layered wiring board with the sub-conductor layers disposed between the dielectric layers, the aperture antenna may be readily fabricated at low cost. Further, because the space surrounded by the antenna conductor wall, the aperture of the upper main conductor layer corresponding to that wall and the lower main conductor layer is set as the quarter wavelength resonant space (spatial resonator) whose one face is shorted and the other one face is opened to radiate electromagnetic wave from the aperture, the radiation frequency may be controlled by changing the size of the aperture and the thickness of the spatial resonator, i.e. the thickness of the dielectric substrate. It gives freedoms in the design. For instance, the thickness of the space forming the aperture antenna may be thinned by enlarging the aperture, so that a number of laminated dielectric layers may be reduced and the antenna may be fabricated at low cost as a result.

Further, since the laminated aperture antenna of the invention may be formed by the conventional lamination technology, it allows the antenna to be integrated in the conventional multi-layered wiring board and the feed line to the antenna and the high-frequency circuit to be formed in the same time.

The laminated aperture antenna of the invention is also characterized in that in the structure described above, the aperture is rectangular and the space is rectangular parallelopiped or the aperture is circular and the space is columnar.

The laminated aperture antenna according to the invention can accommodate with specifications of various antenna characteristics by forming the aperture into the rectangular shape and the spatial resonator into the rectangular parallelopiped shape or by forming the aperture into the circular shape and the spatial resonator into the columnar shape.

The laminated aperture antenna of the invention is characterized in that in addition to the above-mentioned structure, a feeding slot is formed at a region of the lower main conductor layer facing to the space and that a feed line formed of a microstrip line or a coplanar line is connected to the side face of the spatial resonator.

In the laminated aperture antenna according to the invention, it becomes possible to feed electricity by various types of high-frequency lines and to regulate an output by changing the size of the slot by creating the feeding slot at the region of the lower main conductor layer facing to the spatial resonator. When the feed line formed of a microstrip line or a coplanar line is connected to the side face of the spatial resonator, it becomes unnecessary to provide the feed circuit layer separately, allowing to thin the antenna as a whole.

The laminated aperture antenna of the invention is also characterized in that in addition to the above-mentioned structure, the slots or the feed lines are fed to the aperture from two directions crossing at right angles each other and a phase difference of electromagnetic waves fed from the slots or the feed lines is set at 90°.

According to the invention, circularly polarized wave may be generated because the slots or the feed lines are formed to the aperture from the two directions crossing at right angles each other and the phase difference of electromagnetic waves fed from the slots or the feed lines is set at 90°.

The laminated aperture antenna of the invention is also characterized in that in addition to the above-mentioned structure, the aperture is rectangular or elliptic and the feed line is formed to the aperture from the direction of 45° with respect to a side of the rectangle or to an axis of the ellipse.

According to the invention, circularly polarized wave may be generated by feeding electricity through one feed line by regulating the length of two adjacent sides of the rectangle or the length of the major and minor axes of the ellipse because the aperture is rectangular or elliptic and the feed line is formed to the aperture from the direction of 45° with respect to a side of the rectangle or to an axis of the ellipse.

The laminated aperture antenna of the invention is characterized further in that in addition to the above-mentioned structure, a plurality of the spatial resonators are disposed in array.

According to the invention, a wide band and high gain planar array antenna accommodating various specifications such as straightly polarized wave and circularly polarized wave may be provided by disposing the plurality of the spatial resonators in array.

An multi-layered wiring board of the invention comprises the laminated aperture antenna comprising the main conductor layer formed on the surface of a dielectric substrate formed by laminating a plurality of dielectric layers and having the aperture of the predetermined size; the conductor wall composed of the plurality of groups of through conductors formed in the laminating direction around the aperture of the main conductor layer at predetermined intervals and the plurality of sub-conductor layers formed between the dielectric layers so as to electrically connect the plurality of groups of through conductors; and the feed line for feeding electricity; and a high-frequency circuit connected with the feed line. It is also characterized in that a cavity section or a semiconductor element mounting section for storing a semiconductor element and for hermetically sealing it is formed in part of the dielectric substrate.

According to the invention, the antenna may be readily connected with the high-frequency circuit and the energy loss at the connecting section may be reduced by forming the high-frequency circuit in part of the multi-layered wiring board or by creating the cavity in part of the substrate to store the high-frequency semiconductor element therein. Still more, because the antenna, the feed line, the high-frequency circuit and the high-frequency element may be constructed in a body, the whole system may be miniaturized. Further, because the multi-layered wiring board can be fabricated through a series of processes of the conventional lamination technology, the highly reliable multi-layered wiring board can be fabricated at low cost.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1A:
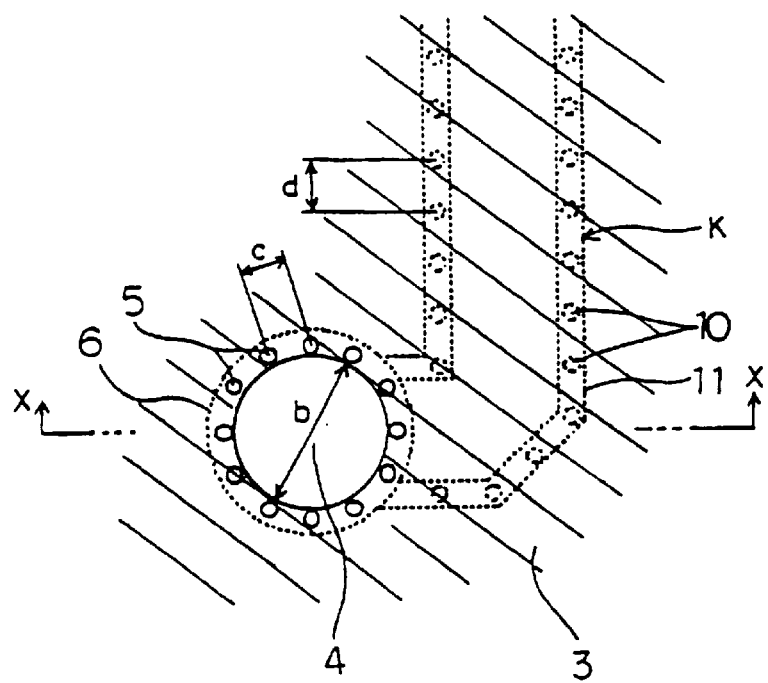
FIG. 1A is a plan view showing a first embodiment of a laminated aperture antenna of the present invention and FIG. 1B is a section view thereof along a line X—X in FIG. 1A.

Now referring to the drawings, preferred embodiments of the invention are described below.

Embodiments concerning to a laminated aperture antenna in which part or whole of a conductor wall composing an antenna comprises a plurality of through conductors such as via-hole conductors disposed at predetermined intervals and a plurality of sub-conductor layers disposed between dielectric layers of a dielectric substrate so as to electrically connect between the through conductors within the dielectric substrate formed by laminating the dielectric layers and to a multi-layered wiring board comprising the laminated aperture antenna will be explained at first.

Figure 1B:
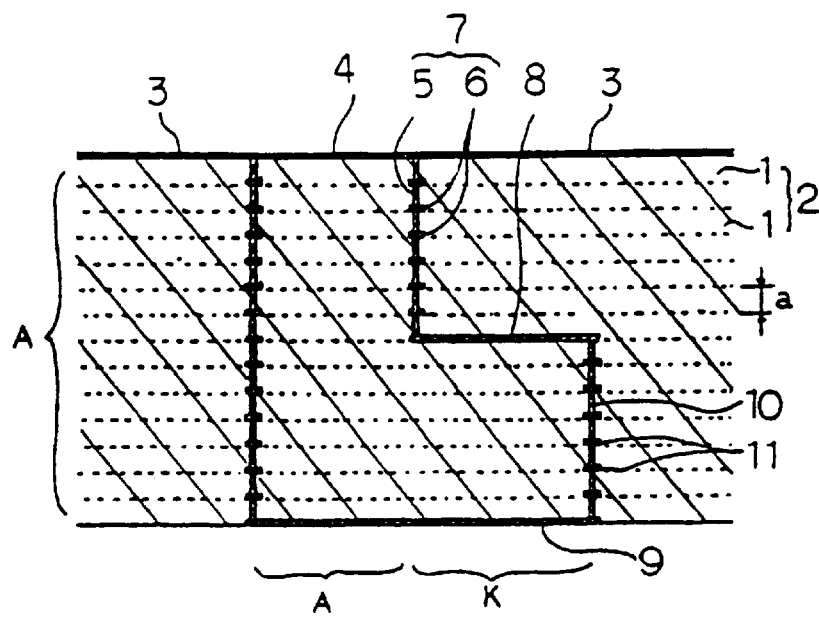

FIG. 1A is a plan view showing a first embodiment of the laminated aperture antenna of the present invention and FIG. 1B is a section view thereof along a line X—X in FIG. 1A. The laminated aperture antenna of the first embodiment comprises, as a base material, a dielectric substrate 2 formed by laminating a plurality of dielectric layers 1 having a predetermined thickness a. A main conductor layer 3 is then adhered and formed on the surface of the dielectric substrate 2. An aperture 4, having a diameter b, which is a radiating section of the antenna is formed through the main conductor layer 3. A plurality of via-hole conductors 5 are then formed through the dielectric substrate 2 in the laminating direction thereof around the aperture 4 of the main conductor layer 3 at predetermined intervals c. The plurality of groups of via-hole conductors 5 are formed through a plurality of ringed sub-conductor layers 6 having an inner diameter b and formed between the dielectric layers 1. The sub-conductor layers 6 and the plurality of groups of via-hole conductors 5 are electrically connected, thus forming a conductor wall 7 composed of grids each having a size of a×c. Thereby, a circular dielectric waveguide antenna section A composed of the conductor wall 7 composed of the grids each having the size of a×c is formed.

Because it is necessary to construct the conductor wall so that no electromagnetic wave leaks, the interval a between the sub-conductor layers 6 and the interval c between the via-hole conductors 5 must be a half or less of the signal wavelength.

The circular dielectric waveguide antenna section A is connected with a feed line K for feeding electricity to the antenna section A. It is desirable to form the feed line K by a dielectric waveguide or a dielectric line so that transmission loss from the feed line K to the antenna section A is small and so that it can be provided readily within the dielectric substrate 2 formed by laminating the plurality of dielectric layers 1 similarly to the antenna section A.

FIGS. 1A and 1B show the case when the feed line K is formed by the dielectric waveguide. The dielectric waveguide is formed of a rectangular dielectric waveguide facing E-plane up comprising a pair of main conductor layers 8 and 9 formed for the feed line in the signal transmitting direction, a group of via-hole conductors 10 formed for the feed line between the main conductor layers 8 and 9 in the laminating direction of the dielectric layers 1 at predetermined intervals d and a plurality of groups of sub-conductor layers 11 formed for the feed line between the dielectric layers 1 so as to electrically connect the via-hole conductors 10.

Then, the feed line K formed of the rectangular dielectric waveguide is connected to the antenna section A formed of the dielectric waveguide formed in the laminating direction of the dielectric substrate 2 from the side face thereof so that the dielectric within the dielectric waveguide of the feed line K links continuously with the dielectric within the dielectric waveguide of the antenna section A. Thereby, the feed line K may be connected electromagnetically with the antenna section A. At this time, the feeding main conductor layer 8 shares its part with the sub-conductor layer 6 of the circular dielectric waveguide antenna section A.

According to the above-mentioned structure connecting the antenna section A with the feed line K, when electromagnetic wave propagated through the feed line K composed of the dielectric waveguide is in a TE10 rectangular waveguide mode, it couples with a TE11 circular waveguide mode in the antenna section A and is radiated from the aperture of the circular waveguide.

It is possible to form only the dielectric layer positioned at the center of the waveguide as a dielectric layer having a high dielectric constant in order to reduce signal transmission loss in the feed line K in the dielectric waveguide used as the feed line K.

It is noted that the main conductor layer 3 formed on the surface of the dielectric substrate 2 is formed so that it acts ru as a flange and enhances electromagnetic wave radiated in the front direction. The electromagnetic wave diffracts at the aperture 4 and propagates also backward when the main conductor layer 3 is not provided.

Figure 2A:
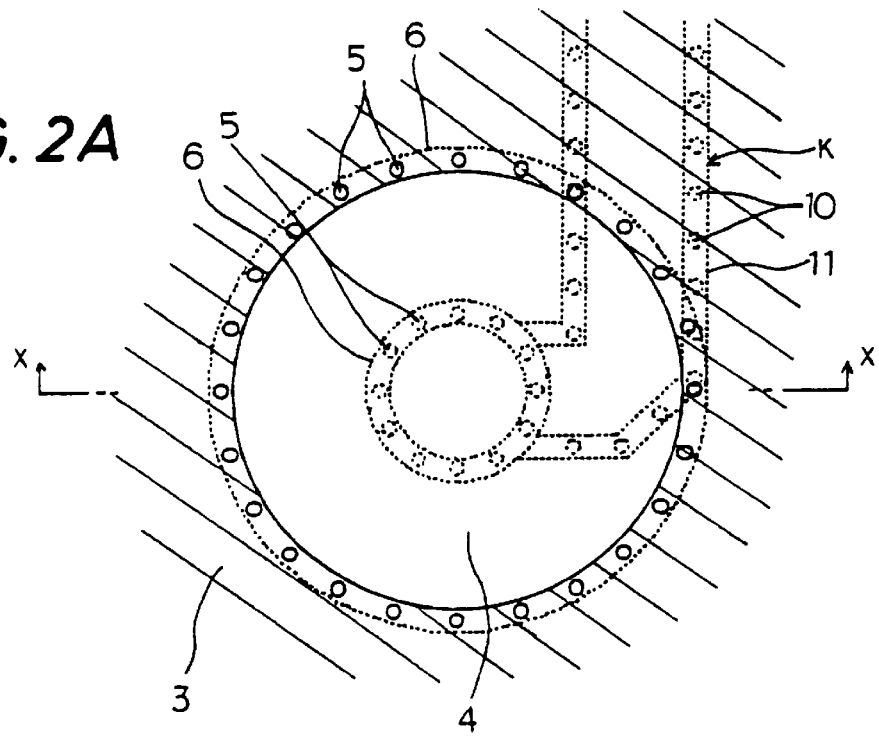
FIG. 2A is a plan view showing a second embodiment of the laminated aperture antenna of the invention and FIG. 2B is a section view thereof along a line X—X in FIG. 2A.
Figure 2B:
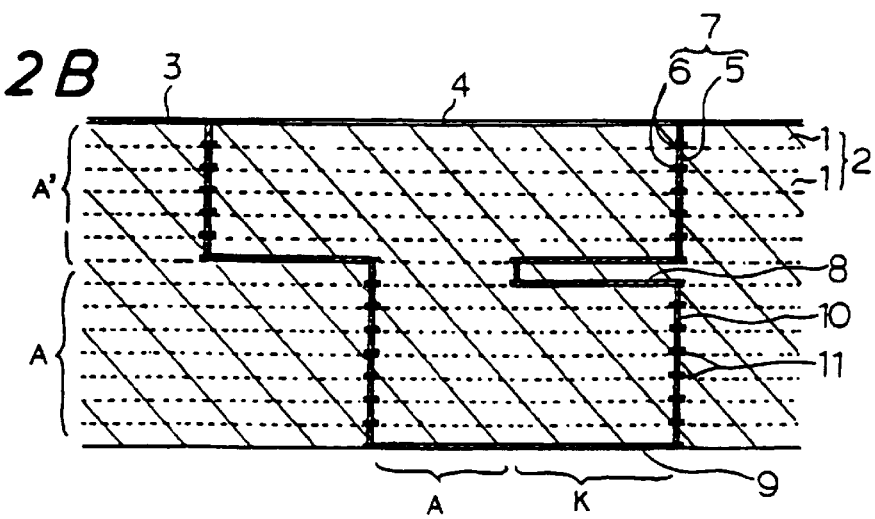

FIG. 2A is a plan view showing a second embodiment of the laminated aperture antenna of the invention and FIG. 2B is a section view thereof along a line X—X in FIG. 2A. In the present embodiment, the diameter of the upper half of the circular dielectric waveguide antenna section A in the antenna shown in FIG. 1 is widened to have a circular dielectric waveguide antenna section A' having the larger diameter. Reflection of signal at the aperture 4 may be reduced by widening the diameter of the conductor wall 7 on the side of the aperture.

Figure 3A:
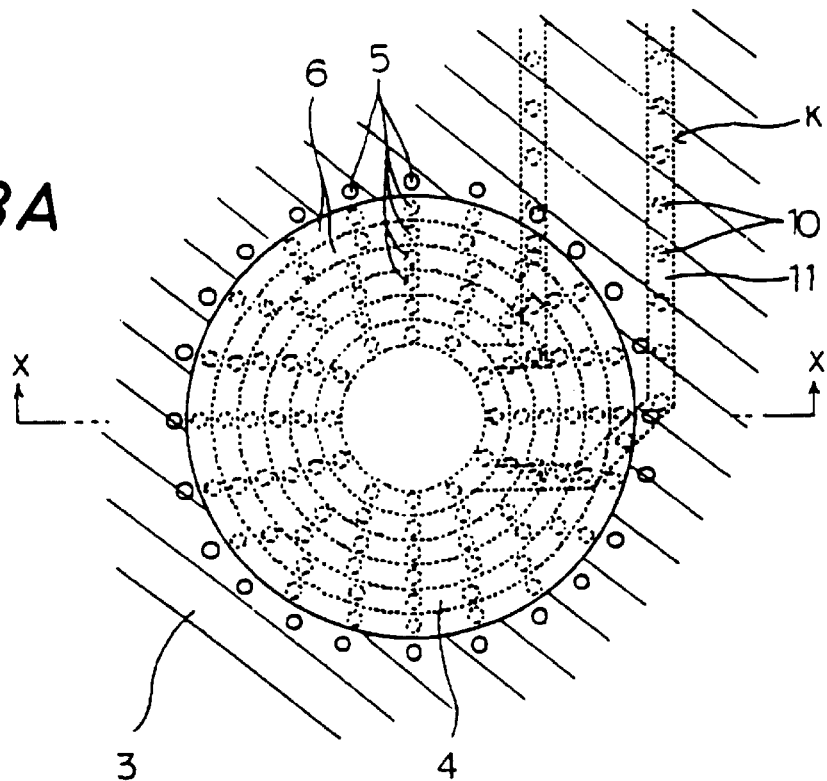
FIG. 3A is a plan view showing a third embodiment of the laminated aperture antenna of the invention and FIG. 3B is a section view thereof along a line X—X in FIG. 3A.
Figure 3B:
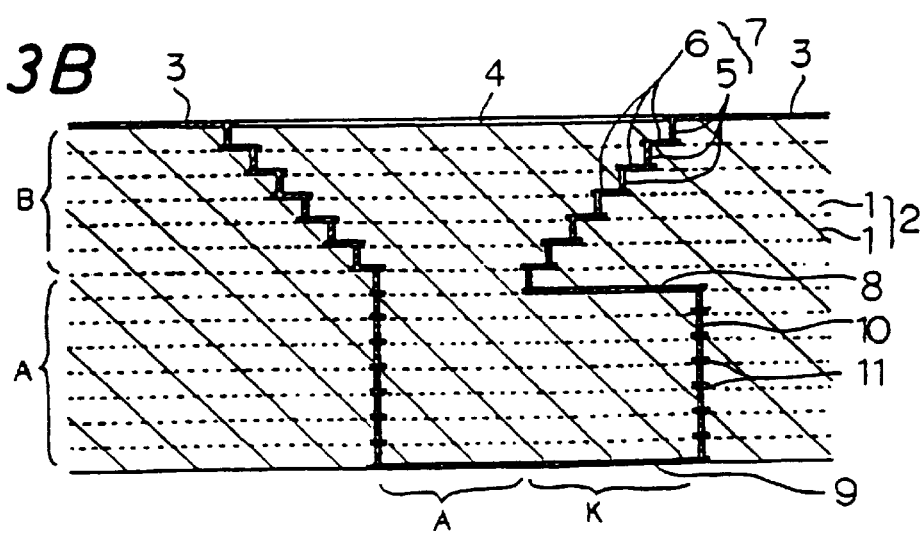

FIG. 3A is a plan view showing a third embodiment of the laminated aperture antenna of the invention and FIG. 3B is a section view thereof along a line X—X in FIG. 3A. According to the present embodiment, the reflection of the signal at the aperture 4 may be reduced further by providing a horn type antenna section B by widening the diameter of the conductor wall 7 of the upper half of the circular dielectric waveguide antenna section A stepwise.

Figure 4A:
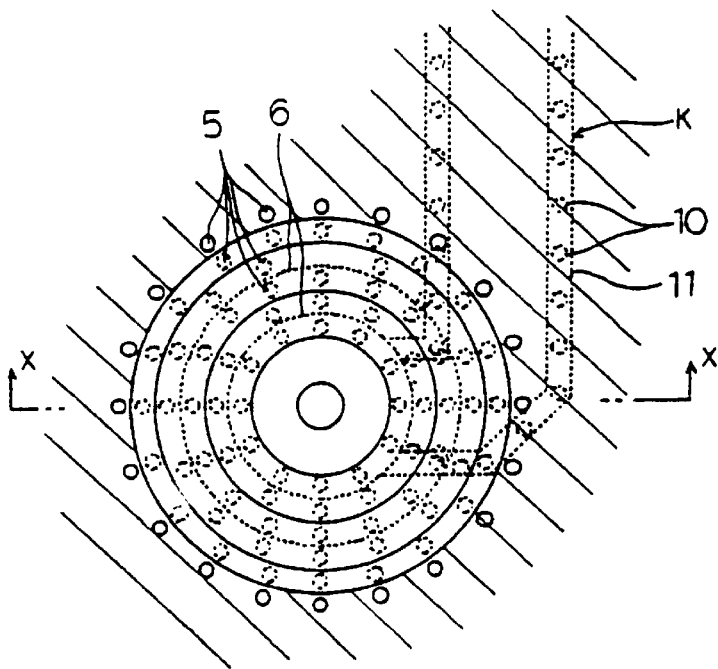
FIG. 4A is a plan view showing a fourth embodiment of the laminated aperture antenna of the invention and FIG. 4B is a section view thereof along a line X—X in FIG. 4A.
Figure 4B:
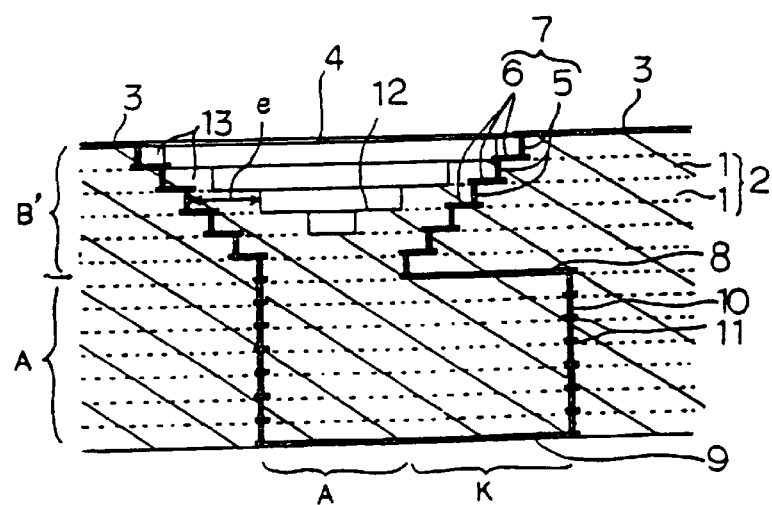

FIG. 4A is a plan view showing a fourth embodiment of the laminated aperture antenna of the invention and FIG. 4B is a section view thereof along a line X—X in FIG. 4A. In the present embodiment, a horn antenna section B' in which a concave portion 12 which expands gradually toward the outer space is provided is formed instead of the horn antenna section B in the third embodiment.

At this time, it is desirable to form the concave portion 12 so that the rate of the remaining dielectric 13 gradually decreases from the circular dielectric waveguide antenna section A of the lower half along the direction of the outer space in the section of the horn antenna section B'. In concrete, the concave portion 12 is formed so that a distance d of the concave portion 12 to the via hole conductor 5 composing the conductor wall 7 in each dielectric layer becomes small gradually toward the outer space. Such structure allows electromagnetic wave to be propagated smoothly to the outer space from the circular dielectric waveguide antenna section A via the horn antenna section B' having the concave portion 12.

Figure 5A:
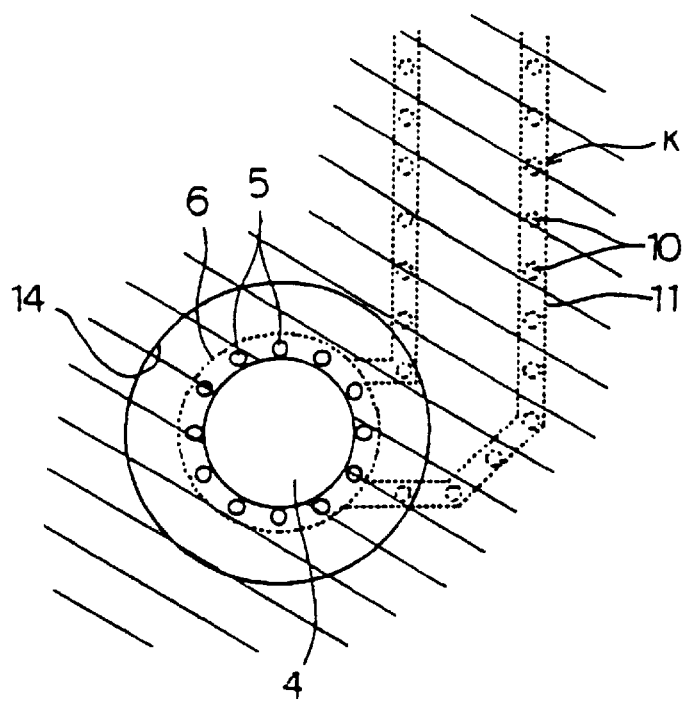
FIG. 5A is a plan view showing a fifth embodiment of the laminated aperture antenna of the invention and FIG. 5B is a section view thereof along a line X—X in FIG. 5A.
Figure 5B:
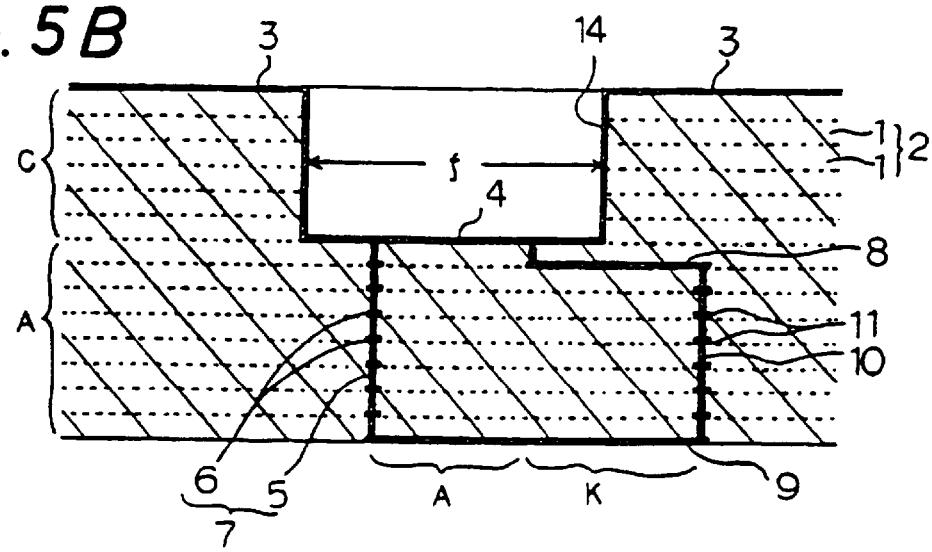

FIG. 5A is a plan view showing a fifth embodiment of the laminated aperture antenna of the invention and FIG. 5B is a section view thereof along a line X—X in FIG. 5A. According to the present embodiment, the upper half of the circular dielectric waveguide antenna section A shown in FIG. 1 is formed by a circular hollow waveguide antenna section C having a diameter f so that part of the main conductor layer 3 functions as a conductor wall 14 composing the circular hollow waveguide antenna section C. The circular hollow waveguide antenna section C is formed by creating a concave portion of the diameter f through the dielectric substrate 2 by laminating dielectric layers each having a hole of the diameter f and by adhering a conductor on the surface thereof other than the aperture 4 existing at the part connecting with the circular dielectric waveguide antenna section A. There is a merit of reducing interactions with other antenna elements in arraying the antennas by providing the circular hollow waveguide antenna section C on the outer space side of the circular dielectric waveguide antenna section A as described above. It is noted that the diameter f of the circular hollow waveguide antenna section C is set so that a characteristic impedance becomes equal to that of the lower circular dielectric waveguide.

Figure 6A:
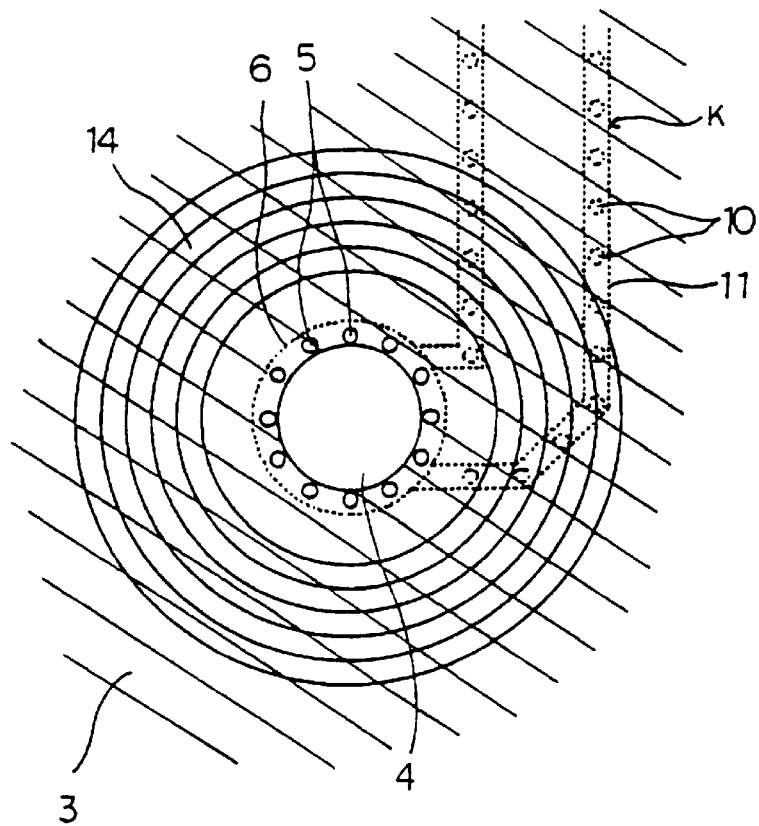
FIG. 6A is a plan view showing a sixth embodiment of the laminated aperture antenna of the invention and FIG. 6B is a section view thereof along a line X—X in FIG. 6A.
Figure 6B:
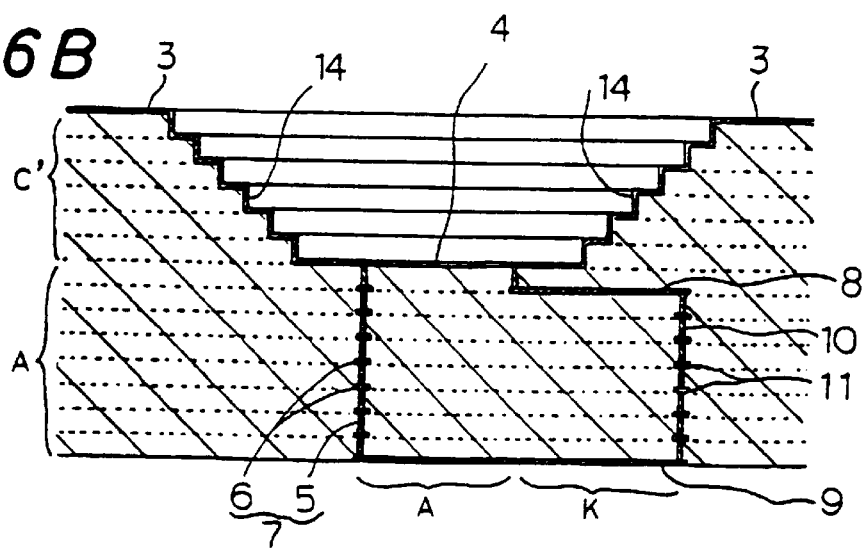

FIG. 6A is a plan view showing a sixth embodiment of the laminated aperture antenna of the invention and FIG. 6B is a section view thereof along a line X—X in FIG. 6A. According to the present embodiment, the diameter f of the circular hollow waveguide antenna section C of the fifth embodiment is expanded gradually toward the outer space to create a horn type antenna section C'. It allows the reflection of signal to be reduced and the characteristic impedance thereof to be approached to that of vacuum stepwise.

Figure 7:
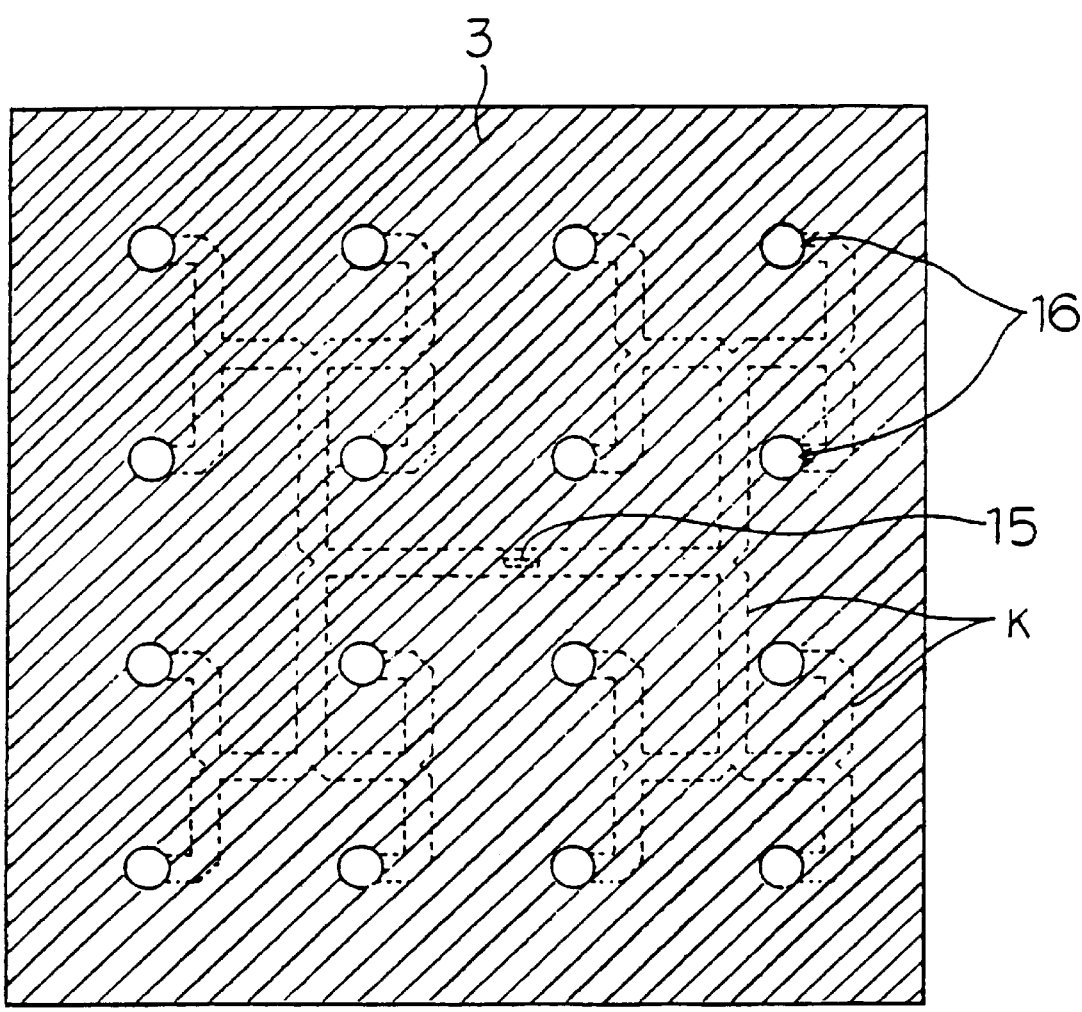
FIG. 7 is a plan view showing an array antenna using the laminated aperture antenna shown in FIG. 1.
Figure 8:
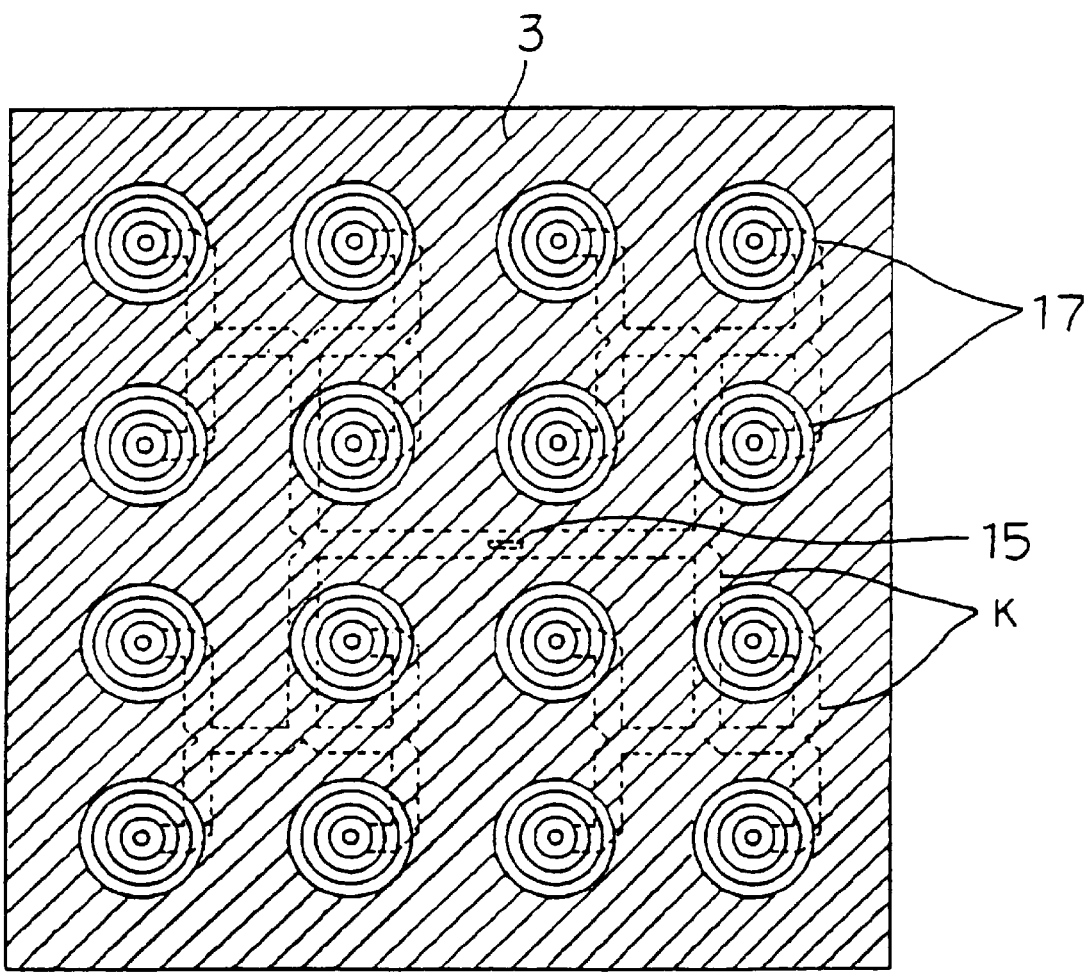
FIG. 8 is a plan view showing an array antenna using the laminated aperture antenna shown in FIG. 4.

Next, an example of an antenna in which above-mentioned various antennas are disposed in array will be explained. FIG. 7 is a plan view showing an array antenna in which aperture antennas 16 each comprising the circular dielectric waveguide antenna section A shown in FIG. 1 are disposed in array. In the array antenna in FIG. 7, a signal fed from a signal input section 15 provided on the feed line K is radiated by reaching to the sixteen aperture antennas 16 by repeating three times of T branch. FIG. 8 is a plan view showing an array antenna in which aperture antennas 17 each having the circular dielectric waveguide antenna section A and the horn antenna section B' having the concave portion 12 as shown in FIG. 4 are disposed in array. Similarly to one shown in FIG. 7, a signal from the signal input section 15 is radiated by reaching to the sixteen aperture antennas 17 by repeating three times of T branch.

Figure 9:
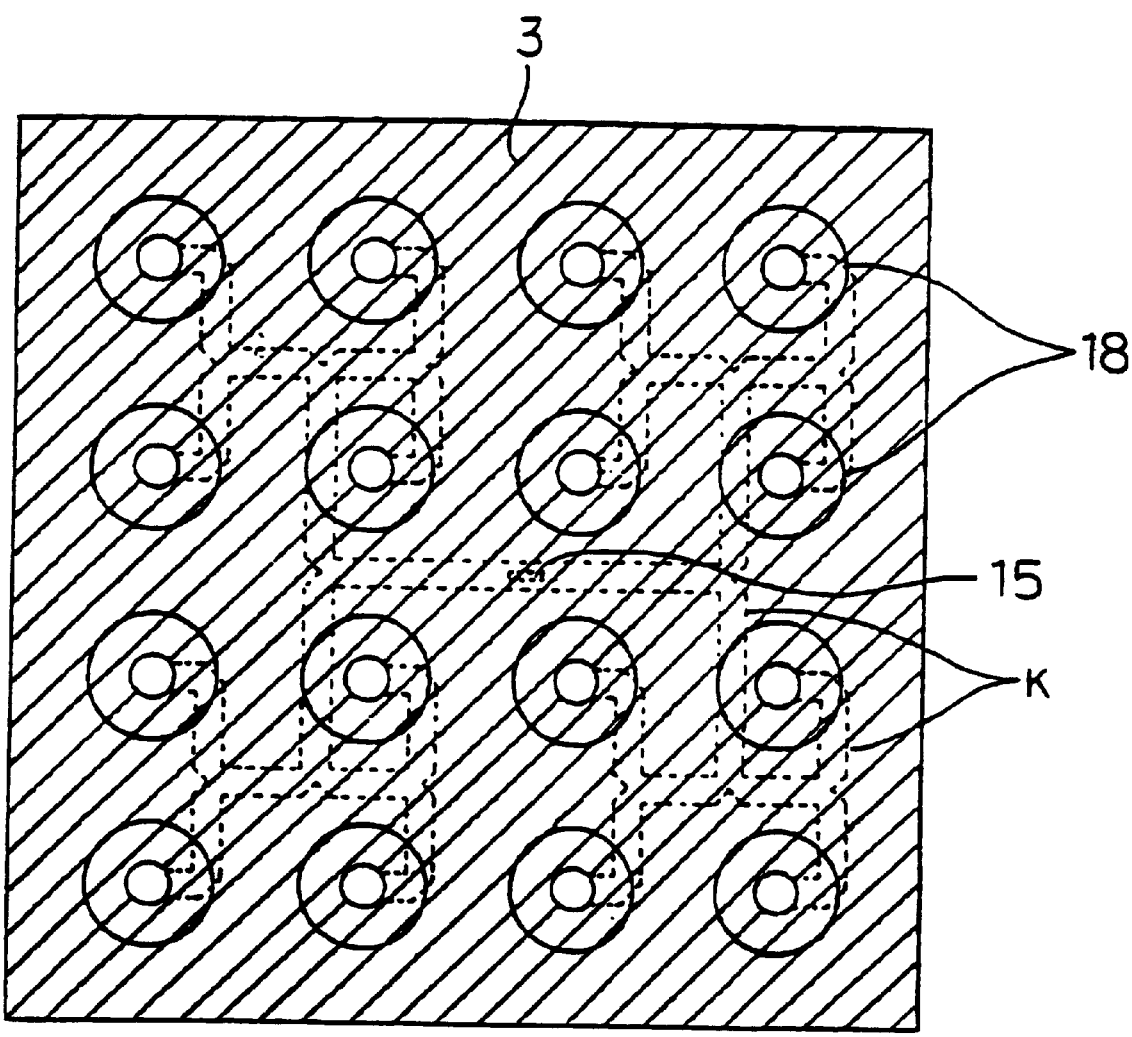
FIG. 9 is a plan view showing an array antenna using the laminated aperture antenna shown in FIG. 5.

FIG. 9 is a plan view showing an array antenna in which aperture antennas 18 each having the circular dielectric waveguide antenna section A and the circular hollow waveguide antenna section C shown in FIG. 5 are disposed in array. Similarly to one shown in FIG. 7, a signal from the signal input section 15 is radiated by reaching to the sixteen aperture antennas 18 by repeating three times of T branch.

Although the aperture antennas of the invention explained so far have had at least the circular dielectric waveguide antenna section A and the antenna section A has been connected with the feed line K in the structure in which all of the feed line K are formed of the rectangular dielectric waveguide in which the E-plane runs parallel with the lamination face of the dielectric layer in the TE10 mode, the connecting structure is not limited only to that.

For instance, the field component of the electromagnetic wave propagating through the feed line K may orient in the laminating direction of the dielectric layers. When the mode of the electromagnetic wave propagating through the dielectric waveguide path is the TE10 mode and that the H-plane is parallel with the lamination face of the dielectric layer for example, the field component must exist within the lamination face in the aperture antenna, so that no electricity can be fed as it is from the feed line K formed of the dielectric waveguide path to the circular dielectric waveguide antenna section A in the connecting structure shown in FIG. 1.

Figure 10:
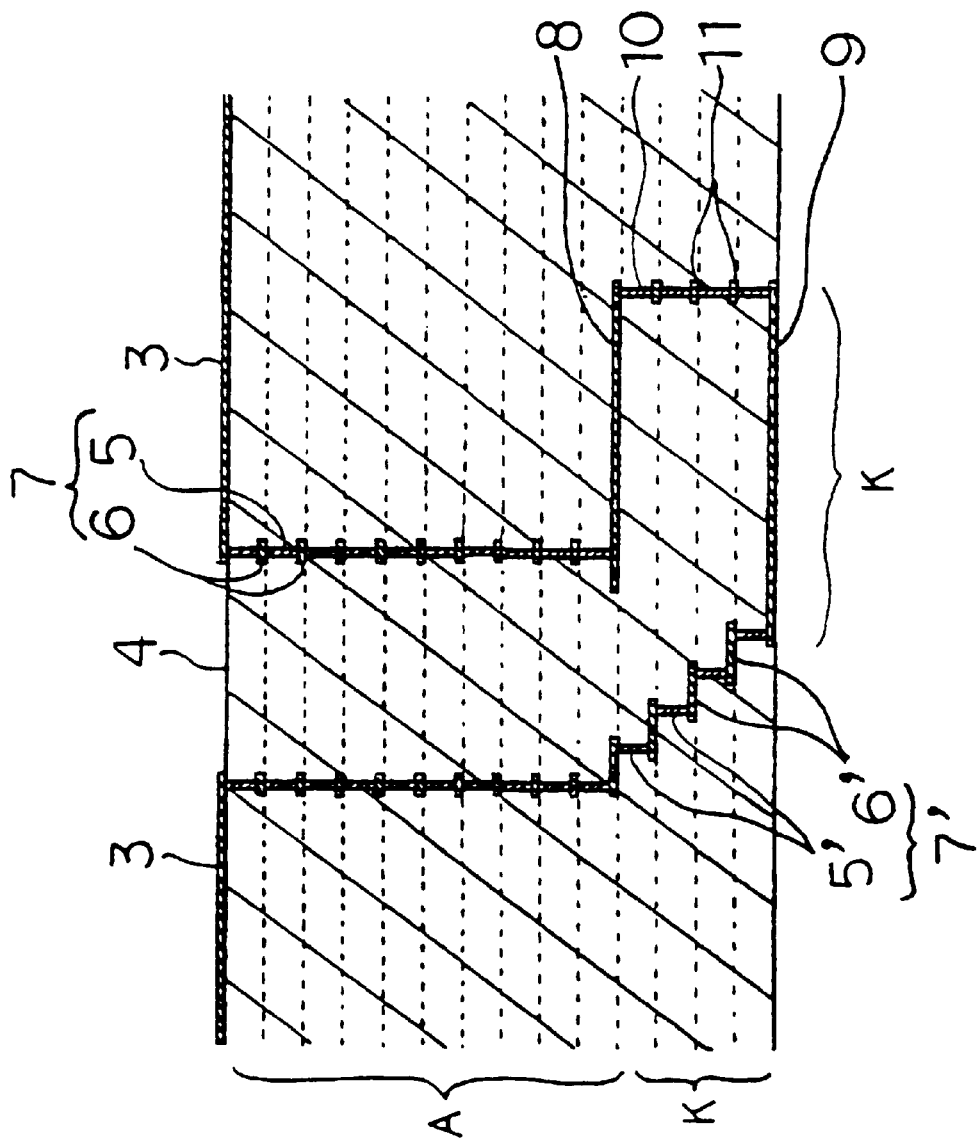
FIG. 10 is a section view for explaining another embodiment of the structure connecting an antenna section A and a feed line K in the aperture antenna of the invention.

In such a case, the orientation of the electric field may be bent into the lamination face and electricity can be fed to the antenna section A by inclining the conductor wall 71 composed of the through hole conductors 5' and the sub-conductor layers 6' at the portion of the circular dielectric waveguide antenna section A connected with the feed line K stepwise as shown in FIG. 10 to bend the H-plane of the dielectric waveguide. Beside that, the electricity can be fed to the antenna section A by disposing the feed line K formed of the dielectric waveguide under the circular dielectric waveguide antenna section A and by creating a slot 19 through part of the feeding main conductor layer 8 of the dielectric waveguide to electromagnetically couple them via the slot 19.

Polarization characteristic is also important as a quality of the electromagnetic wave radiated from the antenna.

Although the structures for mainly radiating straightly polarized wave have been shown in the embodiments described above, it is also possible to generate circularly polarized wave readily by changing the disposition of the feed line K.

Figure 12:
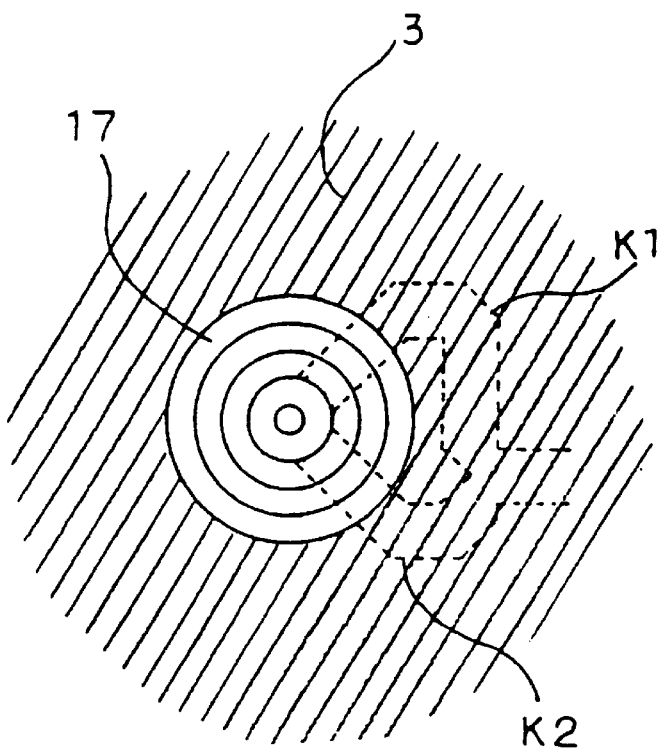
FIG. 12 is a diagram for explaining one example of the aperture antenna for generating circularly polarized wave according to the invention.

For instance, as shown in FIG. 12, circularly polarized wave may be generated by feeding electricity by connecting two feed lines K1 and K2 to the aperture antenna 17 shown in FIG. 4 from two directions crossing at right angles each other and by shifting phases of the electromagnetic wave fed from the respective feed lines by 90°. The phase shift of 90° may be realized by setting a difference of lengths of the feed lines K1 and K2 from their T branch point to the antenna 17 at a quarter of the wavelength within the waveguide.

Figure 13:
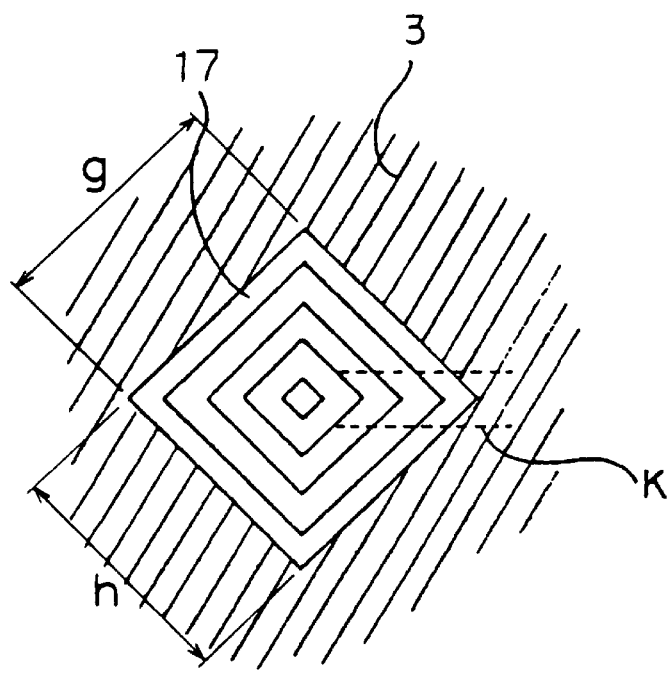
FIG. 13 is a diagram for explaining another example of the aperture antenna for generating circularly polarized wave according to the invention.

FIG. 13 is a diagram showing an embodiment in which the aperture of the aperture antenna is rectangular (square).

Circularly polarized wave may be generated by adjusting lengths of two sides of the rectangle in the same manner with the principle of causing a patch antenna to generate circularly polarized wave by one-point feeding. For example, the phase difference of 90° may be produced and the circularly polarized wave may be generated by setting the length g of one side of the rectangle to be slightly longer than a half of wavelength λ corresponding to an operating frequency $f_o$ so that the phase of current at the time of $f_o$ becomes −45° and by setting the length h of the other side to be slightly shorter than λ/2 so that the phase of current at the time of $f_o$ becomes +45°. When the aperture is elliptic, circularly polarized wave may be generated by adjusting the major and minor diameters thereof.

Figure 11:
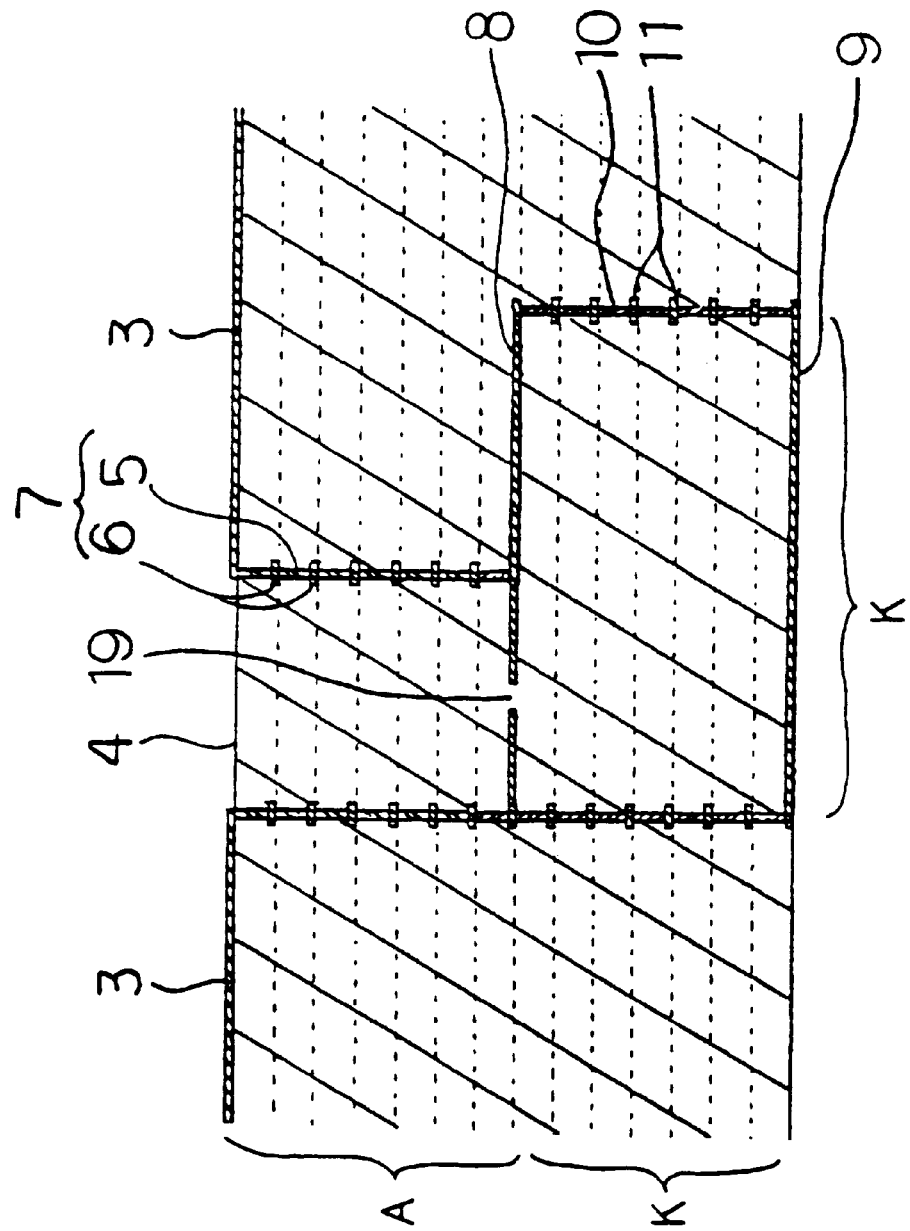
FIG. 11 is a section view for explaining a further example of the structure connecting the antenna section A and the feed line K in the aperture antenna of the invention.

When electricity is fed via the slot 19 like the embodiment shown in FIG. 11, circularly polarized wave may be generated by creating two or more slots which cross at right angles each other through the feeding main conductor layer 8.

Figure 14:
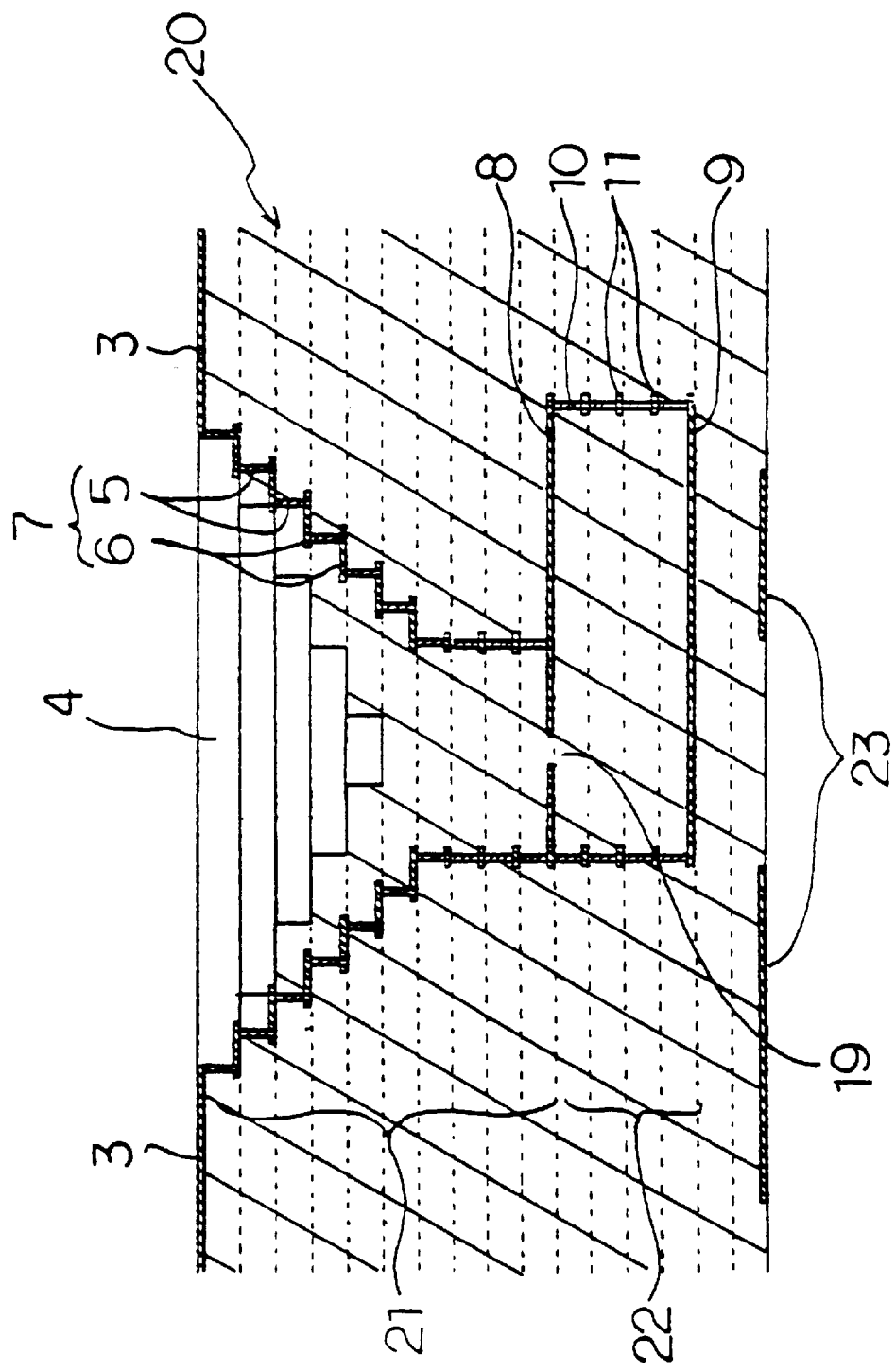
FIG. 14 is a section view for explaining one example of a multi-layered wiring board comprising the aperture antenna of the invention.

Next, the multi-layered wiring board of the invention comprising the above-mentioned laminated aperture antenna will be explained. FIG. 14 is a section view for explaining one embodiment thereof. In the present embodiment, the aperture antenna shown in FIG. 4 is built in a multi-layered wiring board 20. In the multi-layered wiring board 20, an antenna comprising an antenna section 21 and a feed line 22 for feeding electricity to the antenna section 21 through the connecting structure shown in FIG. 11 is formed. Beside them, a high-frequency circuit 23 formed of a coplanar line is formed on the side opposite from the surface where the aperture 4 of the dielectric substrate 2 is formed. Beside the coplanar circuit, a microstrip line, a coplanar line attached with a ground or a dielectric waveguide line may be adopted as the high-frequency circuit 23.

A signal input section (not shown) is provided on the feed line 22 of the antenna as shown in FIGS. 7 through 11 and a signal may be transmitted from the high-frequency circuit to the antenna by connecting the signal input section with the high-frequency circuit 23. The high-frequency circuit and the signal input section of the feed line 22 formed of the dielectric waveguide are connected by a feed pin formed of a via-hole conductor or a slot formed through part of the main conductor layer of the dielectric waveguide.

Figure 15:
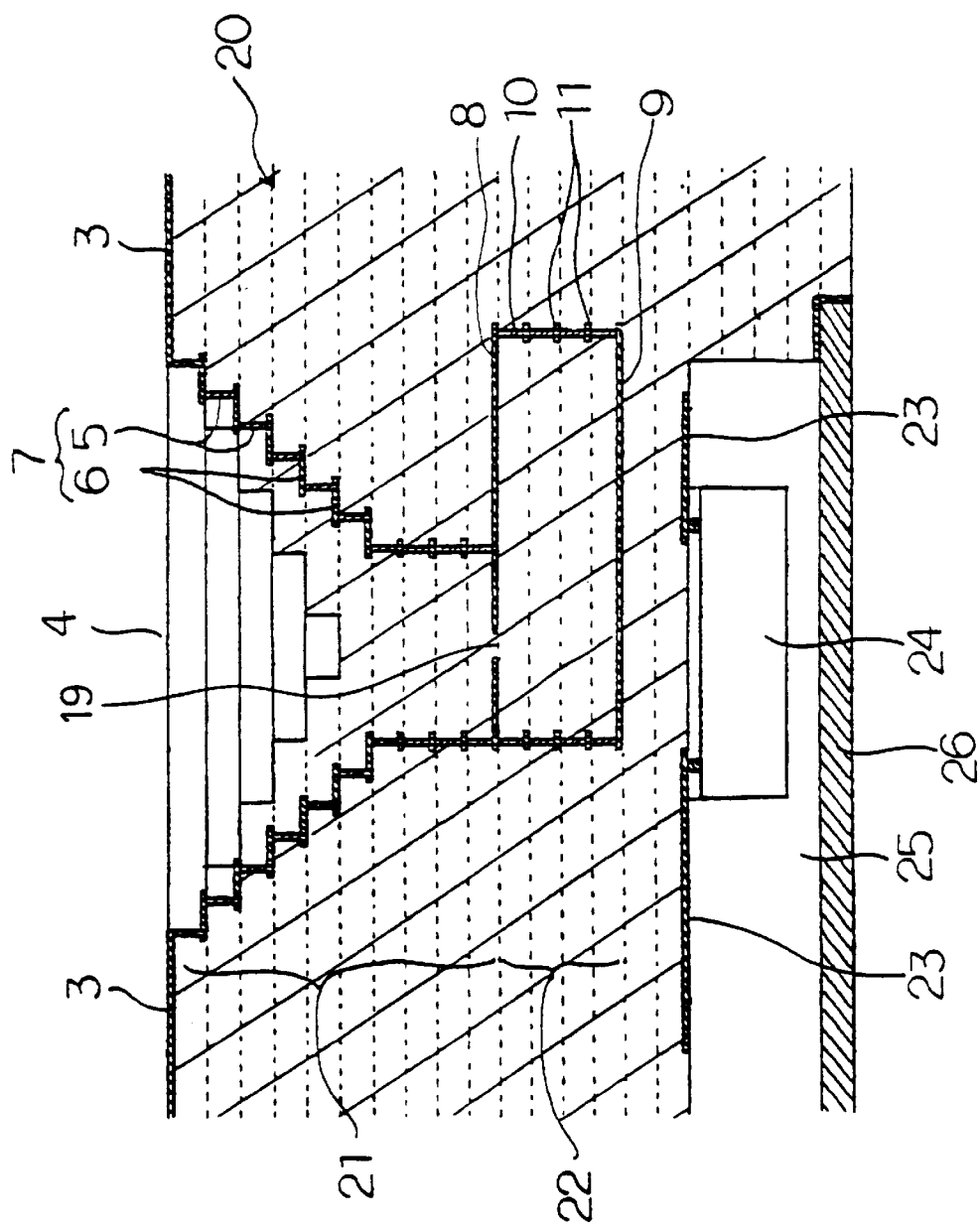
FIG. 15 is a section view for explaining one example of a multi-layered wiring board comprising the aperture antenna and a cavity for storing a semiconductor element of the invention.

Further, a cavity 25 for storing a high-frequency semiconductor element 24 is provided together with the high-frequency circuit 23 in the multi-layered wiring board of the invention as shown in FIG. 15. The semiconductor element 24 stored within the cavity 25 may be mounted so as to be connected with the high-frequency circuit 23 and may be hermetically sealed by a lid 26 made of metal for example. It then allows to provide a package for high-frequency in which the semiconductor element, the high-frequency circuit and the antenna are integrated.

The hermetic seal of the cavity will not be impaired by constructing the feed line 22 by the dielectric waveguide in which dielectric is filled as described above. Further, because the antenna section 21 and the feed line 22 may be fabricated by the technology for laminating the dielectric layers as described above, it is easy to fabricate the high-frequency circuit, the cavity and others on the back in the same time.

Next, embodiments concerning to a laminated aperture antenna in which a conductor wall composing the antenna comprises a plurality via-hole conductors disposed at predetermined intervals and a plurality of sub-conductor layers disposed between dielectric layers of a dielectric substrate so as to electrically connect between the plurality of via-hole conductors within the dielectric substrate formed by laminating the dielectric layers and in which a quarter wavelength resonant space of one-side shorted and one-side opened is formed as a spatial resonator by a space of the dielectric surrounded by a lower conductor layer electrically connected to those described above and an aperture of an upper conductor layer corresponding to the antenna conductor wall and to a multi-layered wiring board comprising the laminated aperture antenna will be explained.

Figure 16:
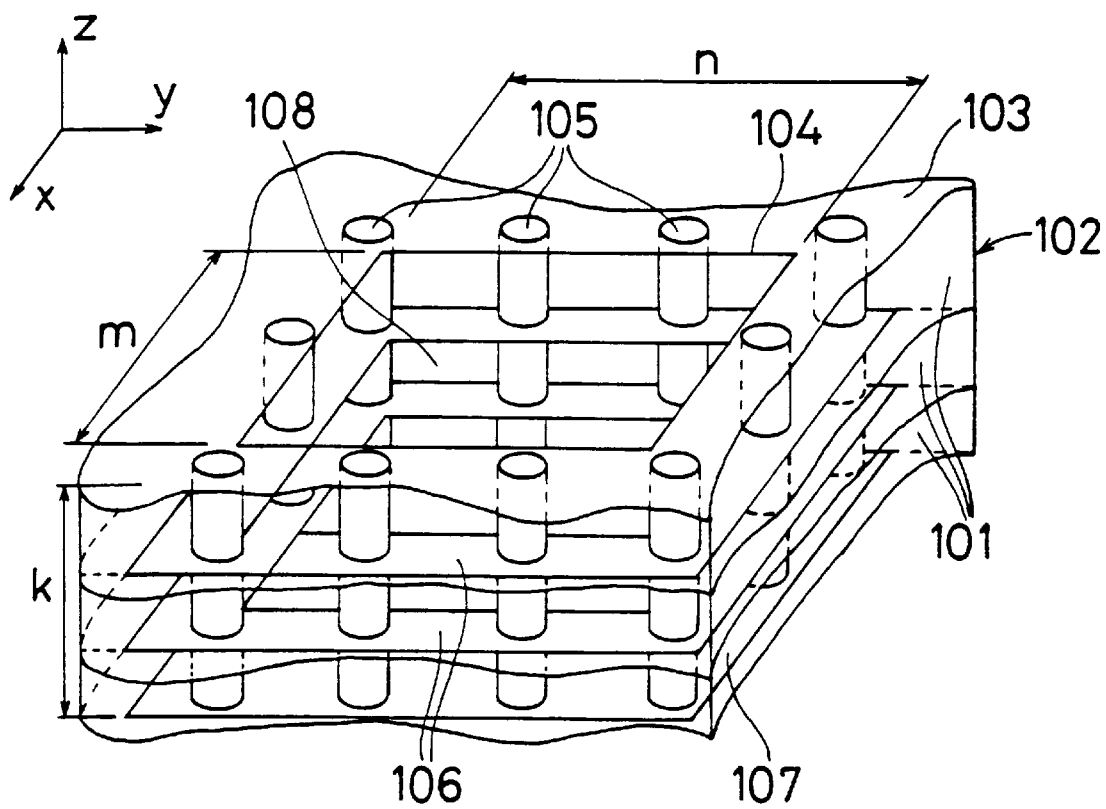
FIG. 16 is a partially perspective diagonal view showing a seventh embodiment of the laminated aperture antenna of the invention.

FIG. 16 is a partially perspective diagonal view showing a seventh embodiment of the laminated aperture antenna of the invention. The laminated aperture antenna of the seventh embodiment comprises, as a base material, a dielectric substrate 102 formed by laminating a plurality of dielectric layers 101 having a predetermined thickness. An upper main conductor layer 103 is then adhered and formed on the surface of the dielectric substrate 102 and a lower main conductor layer 107 is adhered and formed on the back side. It is noted that FIG. 16 shows a state in which the dielectric layers 101 are seen through in part of the dielectric substrate 102.

A rectangular aperture 104 whose size is m×n for example and which turns out to be a radiating section of the antenna is formed through the main conductor layer 103. A plurality of through conductors 105 such as via-hole conductors and through-hole conductors are formed through the dielectric substrate 102 at predetermined intervals in the laminating direction of the dielectric layers 101 around the aperture 104 of the main conductor layer 103. The plurality of groups of through conductors 105 are formed through a plurality of stripped sub-conductor layers 106 whose aperture size is m×n and which are formed between the dielectric layers 101 and the sub-conductor layers 106 and the plurality of groups of via-hole conductors 105 are electrically connected, thus forming the antenna conductor wall having length k in the Z direction and which is parallel to the z-x plane and the y-z plane as shown in the figure.

The lower main conductor layer 107 which is electrically connected to the antenna conductor wall is formed so as to cover at least an area larger than the aperture 104 whose size is m×n under the dielectric substrate 102, e.g. on the back of the dielectric substrate 102 or at the position facing to the aperture 104 between the dielectric layers 101. As a result, the spatial resonator formed of a space 108 whose size is m×n×k and which is surrounded by the upper main conductor layer 103 having the aperture 104, the antenna conductor wall composed of the plurality of groups of through conductors 105 and the plurality of groups of sub-conductor layers 106 and the lower main conductor layer 107 is formed, thus forming a dielectric waveguide antenna as the laminated aperture antenna.

It is noted that because it is necessary to form the conductor wall so that no electromagnetic wave leaks, the sub-conductor layers 106 and the through conductors 105 must be arrayed at intervals of at least below a half of the signal wavelength or desirably of a quarter or less of the signal wavelength.

Because this antenna applies the principle of a quarter wavelength resonator whose one-side is shorted and the other one-side is opened, the characteristic of electromagnetic wave radiated from the aperture differs depending on the resonating mode. Accordingly, while various applications are conceivable depending on its purposes (for example, electromagnetic wave is not radiated in the antenna front direction and is radiated in a certain angle ±θ direction when a rectangular parallelopiped $TE_{111}$ mode is used), a rectangular parallelopiped $TE_{101}$ mode is desirable in general. Frequency of the electromagnetic wave radiated from the antenna at this time may be calculated approximately by the following equation (1):

$$f = 150 \times \left\{ \left(\frac{1}{m}\right)^2 + \left(\frac{1}{2k}\right)^2 \right\}^{1/2} \times \varepsilon^{-1/2} \text{ [GHz]} \tag{1}$$

where, $\varepsilon$ is relative dielectric constant and a unit of m and k is mm.

Here, while the width n of the aperture 104 may be less than the length m, it must be careful not to be too small because energy loss caused by the conductor becomes large.

While the case when the spatial resonator is the rectangular parallelopiped has been shown in the above-mentioned embodiment, the same applies also when the resonant space is columnar having a radius of r. However, the mode is desirable to be columnar $TE_{111}$ mode in this case. Frequency of electromagnetic wave radiated from the antenna at this time may be calculated approximately by the following equation (2):

$$f = 150 \times \left\{ \left(\frac{1}{2k}\right)^2 + \left(\frac{\chi'_{11}}{\pi r}\right)^2 \right\}^{1/2} \times \varepsilon^{-1/2} \text{ [GHz]} \tag{2}$$

where, $\chi_{11}'$ is the first root of derivative of primary Bessel function and a unit of r and k is mm.

A structure for feeding electricity to the antenna section is required in order to use such laminated aperture antenna in reality.

Figure 17:
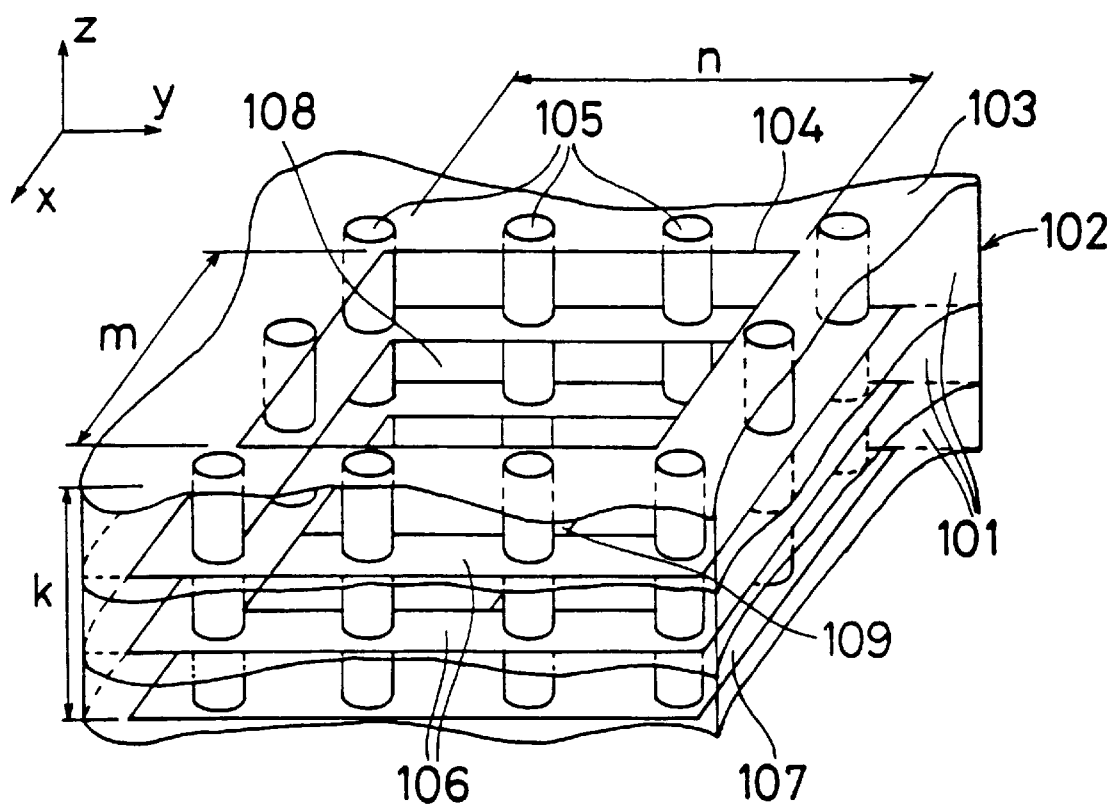
FIG. 17 is a partially perspective diagonal view showing an eighth embodiment of the laminated aperture antenna of the invention.

FIG. 17 is a partially perspective diagonal view showing an eighth embodiment of the laminated aperture antenna of the invention. In FIG. 17, the same reference numerals refer to the same parts in FIG. 16. In the present embodiment, a feeding slot 109 is created at a region facing to the space 108 of the same parts in FIG. 16. Electricity may be fed by a waveguide, a laminated waveguide, microstrip line or the like through the intermediary of electromagnetic coupling caused by the slot 109.

The slot 109 formed through the lower main conductor layer 107 allows electricity to be fed by various types of high-frequency lines as described above and an output to be regulated by changing the size thereof.

Figure 18:
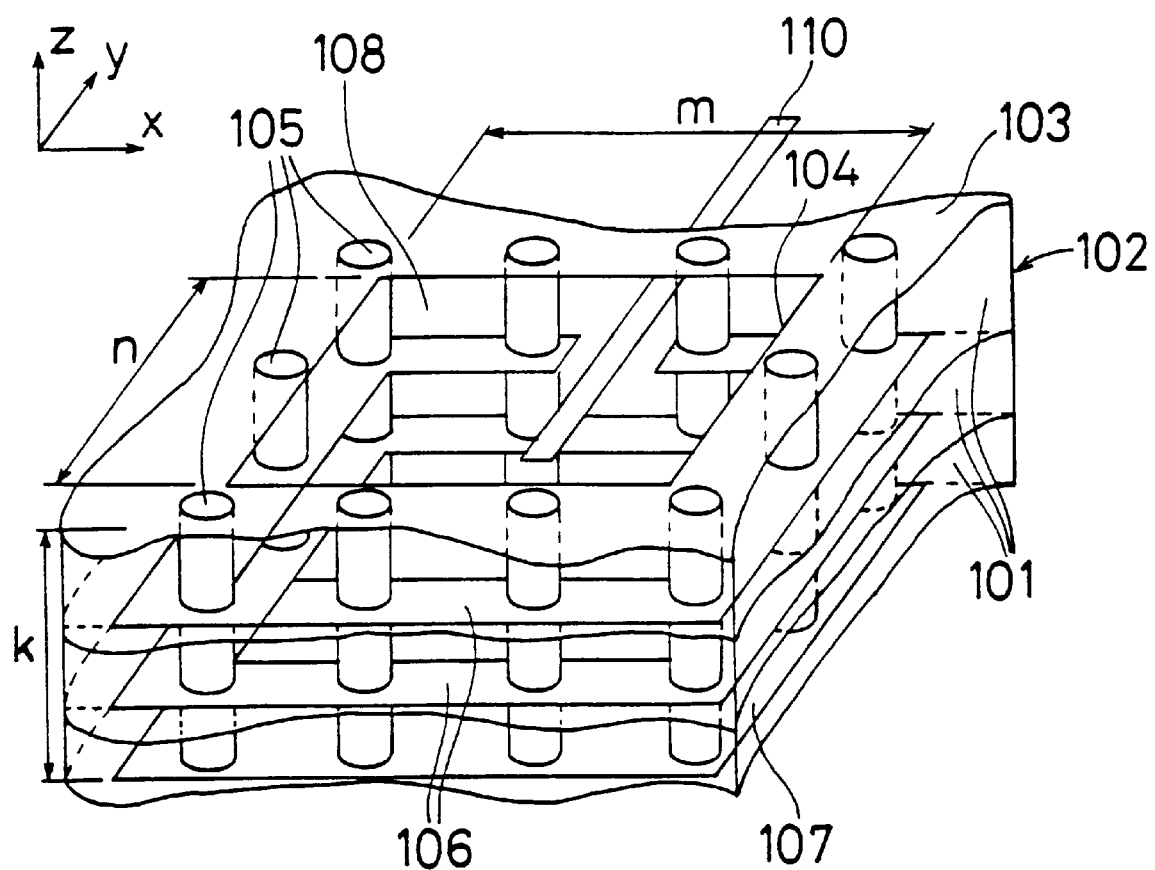
FIG. 18 is a partially perspective diagonal view showing a ninth embodiment of the laminated aperture antenna of the invention.

FIG. 18 is a partially perspective diagonal view showing a ninth embodiment of the laminated aperture antenna of the invention. In FIG. 18, the same reference also refer to the same parts in FIGS. 16 and 17.

According to the ninth embodiment, a hole is perforated through part of the antenna conductor wall composed of the plurality of through conductors 105 and the plurality of sub-conductor layers 106 to insert a feed line 110 to feed electricity to the spatial resonator. It is conceivable to use a microstrip line or a coplanar line as the feed line 110 at the outside area of the spatial resonator.

It becomes unnecessary to provide a feed circuit layer separately and a thin antenna may be realized as a whole by connecting the feed line 110 formed of the microstrip line or the coplanar line to the side face of the spatial resonator as described above.

Figure 19:
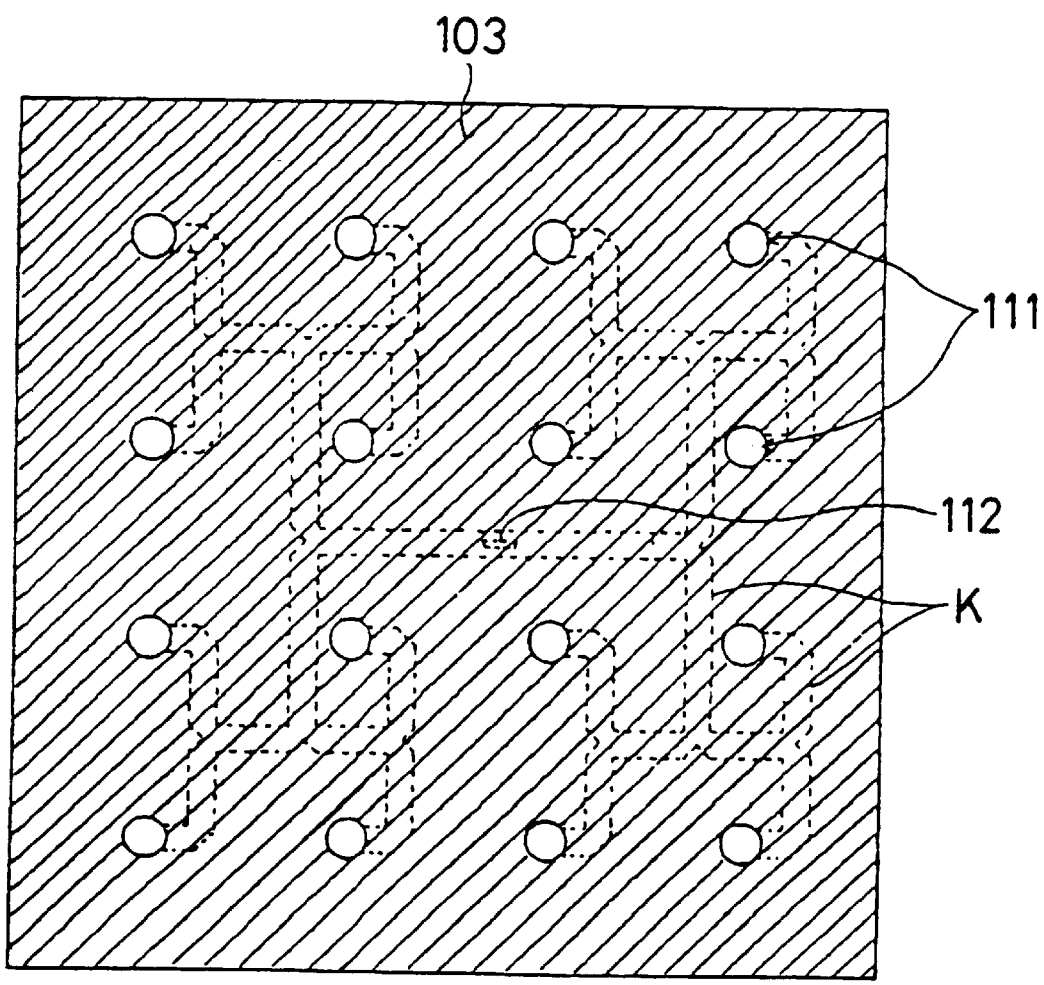
FIG. 19 is a plan view showing an array antenna using the laminated aperture antenna shown in FIG. 17.

FIG. 19 is a plan view showing an array antenna in which the laminated aperture antennas of the seventh through ninth embodiments are arrayed on the dielectric substrate. In the array antenna shown in FIG. 19, a signal input from a signal input section 112 passes through the feed circuit K, repeats three times of T branch and is radiated by reaching to each of sixteen aperture antennas 111 disposed in array. Here, when the laminated waveguide is used as the feed circuit K, the feeding structure like the slot 109 as shown in FIG. 17 becomes necessary for example in each aperture antenna 111. When the coplanar line or the microstrip line is used as the feeding circuit K, electricity may be fed directly from the side face of each aperture antenna 111 by the structure as shown in FIG. 18.

Polarization characteristic is also important as a quality of the electromagnetic wave radiated from the laminated aperture antenna 111. Although the structures for mainly radiating straightly polarized wave have been shown in the seventh through ninth embodiments, it is also possible to generate circularly polarized wave readily by changing the disposition of the feed line K.

Figure 20:
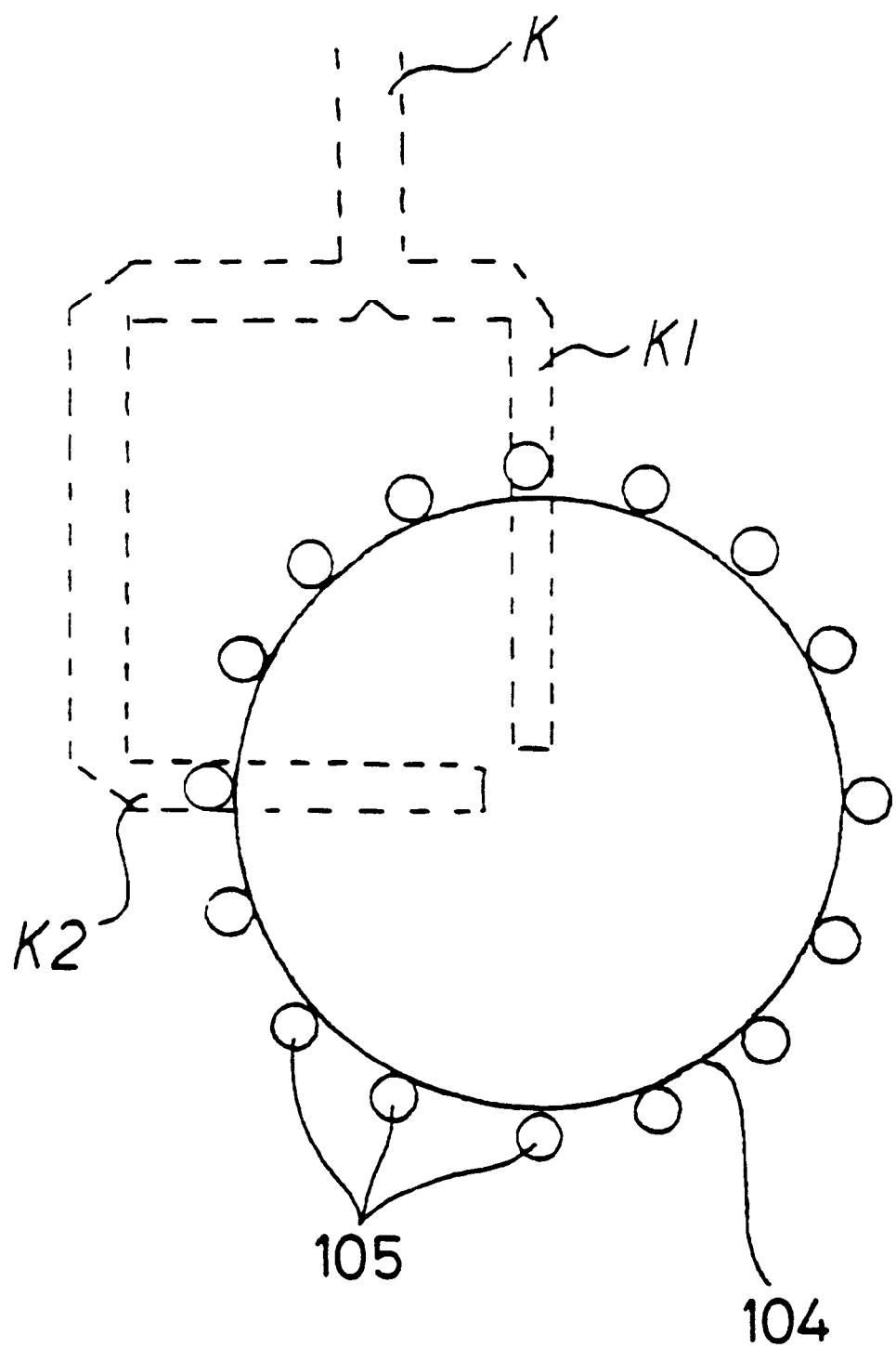
FIG. 20 is plan view for explaining one example of the structure for generating circularly polarized wave in the laminated aperture antenna of the invention.

For instance, as shown in a plan view in FIG. 20, circularly polarized wave may be generated by feeding electricity to the laminated aperture antenna of the seventh through ninth embodiments shown by the aperture 104 and the through conductors 105 (although the figure shows the case when the spatial resonator is columnar, it may be rectangular parallelopiped) by connecting the feed circuit K to two T-ramified feed lines K1 and K2 to the aperture antenna from two directions crossing at right angles each other and by shifting phases of the electromagnetic wave fed from the respective feed lines Ki and K2 by 90°. The phase shift of 90° may be realized by setting a difference of the length of the feed lines K1 and K2 from their T branch point to the antenna at a quarter of the propagation wavelength.

Figure 21:
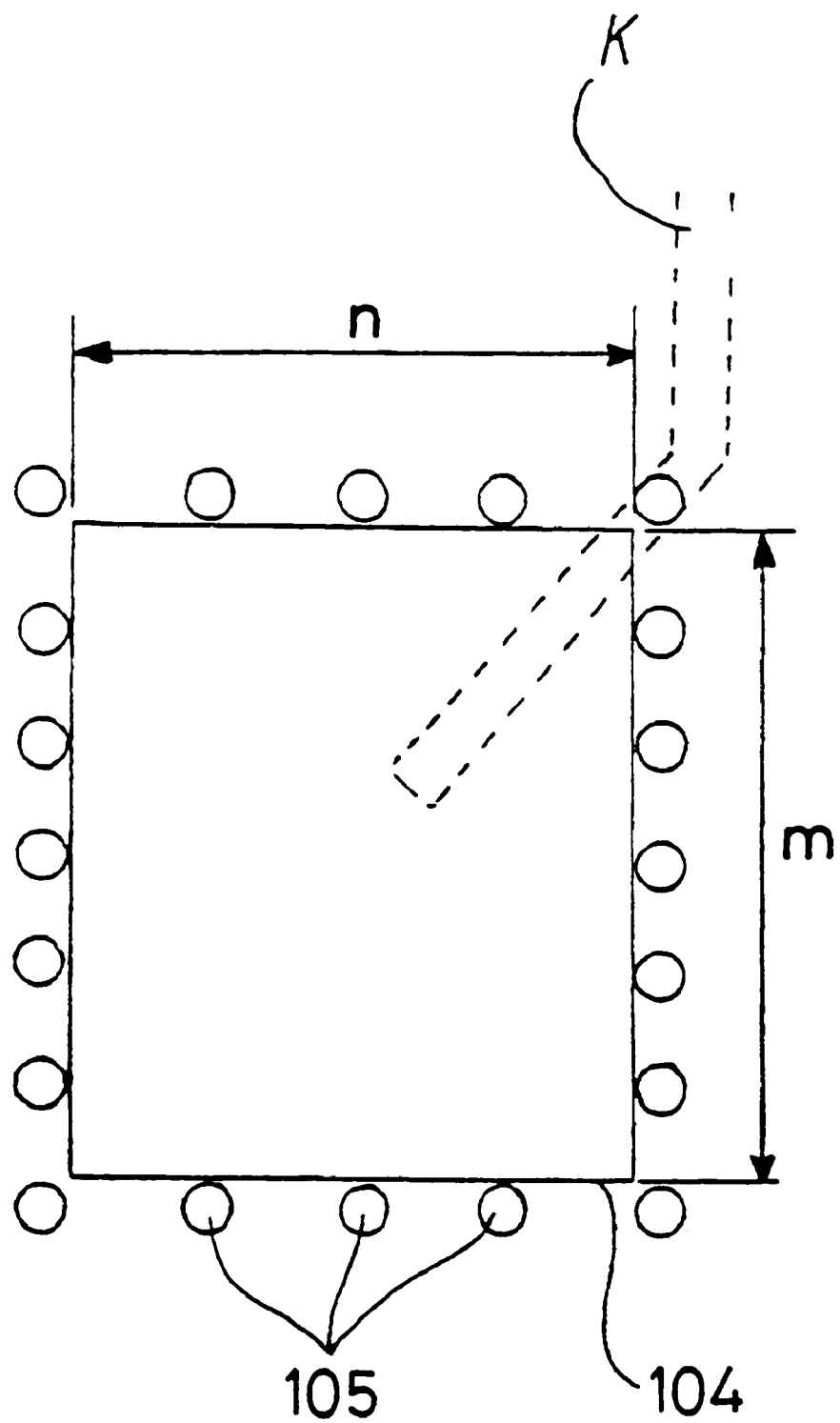
FIG. 21 is plan view for explaining another example of the structure for generating circularly polarized wave in the laminated aperture antenna of the invention.

Circularly polarized wave may be generated also by a feed circuit K composed of one feed line as shown in a plan view in FIG. 21. Although FIG. 21 shows a case when the aperture 104 is a rectangular having an aperture size of m×n, the same applies also when the aperture 104 is elliptic having m×n of minor and major diameters. Thus, the circularly polarized wave may be generated by adjusting the length of two sides of the rectangular aperture 104 in the same manner with the principle of causing the patch antenna to generate circularly polarized wave by one-point feeding. For example, the phase difference of 90° may be produced and the circularly polarized wave may be generated by setting the length m of one side of the rectangle to be slightly longer than a half of wavelength λ corresponding to an operating frequency $f_o$ so that the phase of current at the time of $f_o$ becomes −45° and by setting the length n of the other side to be slightly shorter than λ/2 so that the phase of current at the time of $f_o$ becomes +45°. When the aperture 104 is elliptic, circularly polarized wave may be generated in the same manner by adjusting the lengths m and n of the major and minor diameters thereof respectively.

Figure 22:
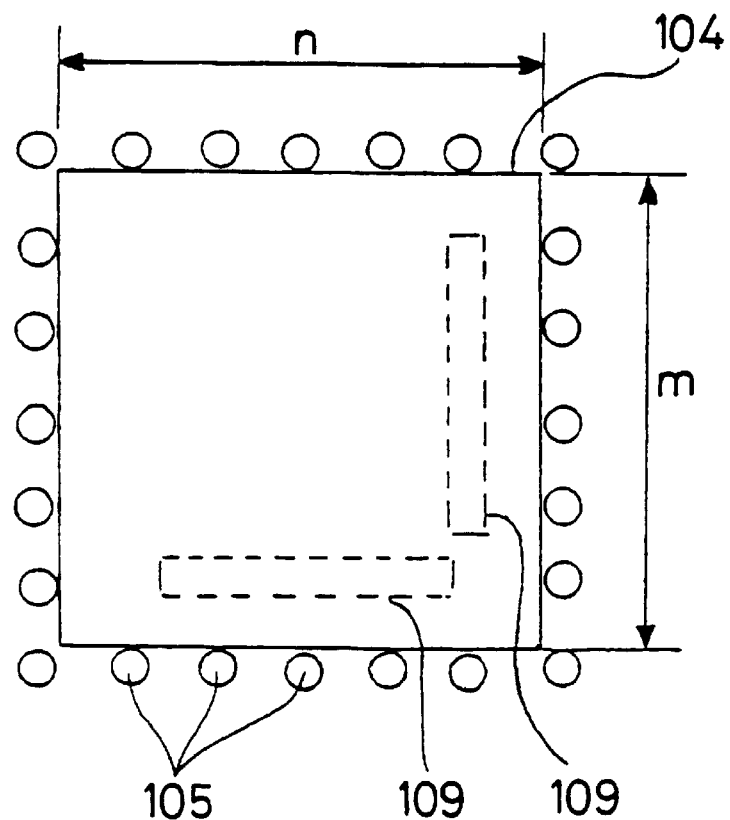
FIG. 22 is plan view for explaining a further example of the structure for generating circularly polarized wave in the laminated aperture antenna of the invention.

As shown in a plan view in FIG. 22, when electricity is fed via the slot 109 shown in FIG. 17, circularly polarized wave may be generated by creating two or more slots 109 which cross at right angles each other through the lower main conductor layer 107.

Figure 23:
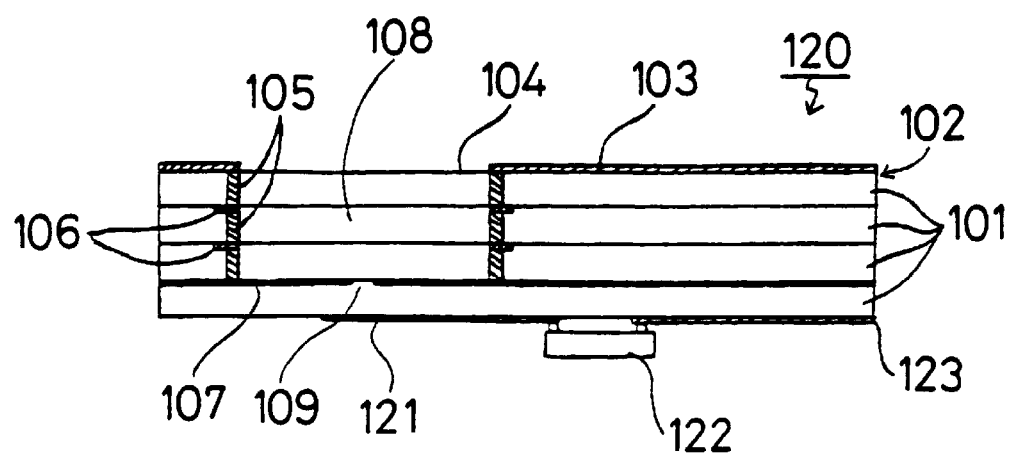
FIG. 23 is a section view showing another embodiment of the multi-layered wiring board comprising the laminated aperture antenna of the invention.

Next, the multi-layered wiring board of the invention comprising the laminated aperture antenna of the seventh through ninth embodiments will be explained. FIG. 23 is a section view for explaining an embodiment thereof. In the present embodiment, the laminated aperture antenna in the eighth embodiment having the structure shown in FIG. 17 is built in a multi-layered wiring board 120. In FIG. 23, the same reference numerals refer also to the same parts in FIGS. 16 through 22.

In the multi-layered wiring board 120, the laminated aperture antenna of the invention comprising an antenna section having the space (spatial resonator) 108 formed by the upper main conductor layer 103 having the aperture 104, the plurality of through conductors 105, the plurality of sub-conductor layers 106 and the lower main conductor layer 107 in the dielectric substrate 102 formed by laminating the plurality of dielectric layers 101 and a feed line K for feeding to the antenna section with the connecting structure by means 36 of the slot 109 shown in FIG. 17 is formed. Beside them, a high-frequency circuit 121 composed of a high-frequency semiconductor element 122 mounted on a semiconductor element mounting section and a microstrip line is formed on the side opposite from the upper surface where the aperture 104 of the dielectric substrate 102 is formed. Beside the microstrip line, the high-frequency circuit 121 may be composed of a coplanar line, a coplanar line attached with a ground or a dielectric waveguide line.

A signal input section 123 is provided on the high-frequency circuit 121 and a signal may be transmitted from the high-frequency circuit 121 to the antenna section by connecting the signal input section 123 directly with the high-frequency circuit 121 or via the high-frequency semiconductor element 122 having a function as an amplifier and others as shown in the figure.

Further, a cavity for storing the high-frequency semiconductor element 122 is provided together with the high-frequency circuit 121 as the semiconductor element mounting section in the multi-layered wiring board 120 of the invention. The high-frequency semiconductor element 122 may be hermetically sealed by a lid (not shown) made of metal for example. It may be hermetically sealed also by attaching a cap-like lid having a void inside to the flat semiconductor element mounting section. It then allows to provide a package for high-frequency in which the semiconductor element, the high-frequency circuit and the laminated aperture antenna are integrated.

In view of transmission loss and of required precision in the fabrication, it is preferable to construct the dielectric substrate in the antenna section and the feed line forming section by a dielectric material having lowest possible dielectric constant in the first through ninth embodiments. However, in case when the high-frequency circuits 23 and 121 comprise the microstrip line or the coplanar line, the relative dielectric constant is desirable to be around 10 to 15 considering the size of the high-frequency circuits 23 and 121 and a gap between the ground. The dielectric layers in each embodiment described above may be any dielectric material as long as it can be sheeted to an appropriate thickness, can be metallized, allows the through conductors such as via-hole conductors to be formed and can be closely laminated. It may be ceramics, glass ceramics, resin or a mixture of resin and ceramic powder for example. Further, dielectric tangent of the dielectric material is desirable to be small, i.e. to be less than 0.001 with the frequency used, in order to minimize the transmission loss of the high-frequency signal. Further, the metallized metal which is adhered and formed on the dielectric layer and which turns out to be the upper main conductor layer, the sub-conductor layers, the lower main conductor layer and the like is desired to be a low-resistant conductor. In concrete, it is preferable to have at least any one of gold, silver and copper as its main component.

Next, results obtained by analyzing the characteristics of the laminated aperture antenna of the invention will be explained based on FIGS. 24 and 25.

As the laminated aperture antenna, one explained in the eighth embodiment shown in FIG. 17 was fabricated. It is the one in which the laminated waveguide is used as the feed line and electricity is fed through the slot provided through the lower main conductor layer. The shape of the antenna, i.e. the space (spatial resonator), was rectangular parallelopiped having m=3.4 mm, n=1.3 mm and k=0.5 mm and the center frequency was 77 GHz. Low temperature sintered glass ceramics whose relative dielectric constant $\epsilon$=5 and dielectric loss tan$\delta$=0.0008 was used as the dielectric material of the dielectric layers and copper was used for the metallization. The shape of the slot was 0.8 mm in length× 0.1 mm in width.

Figure 24:
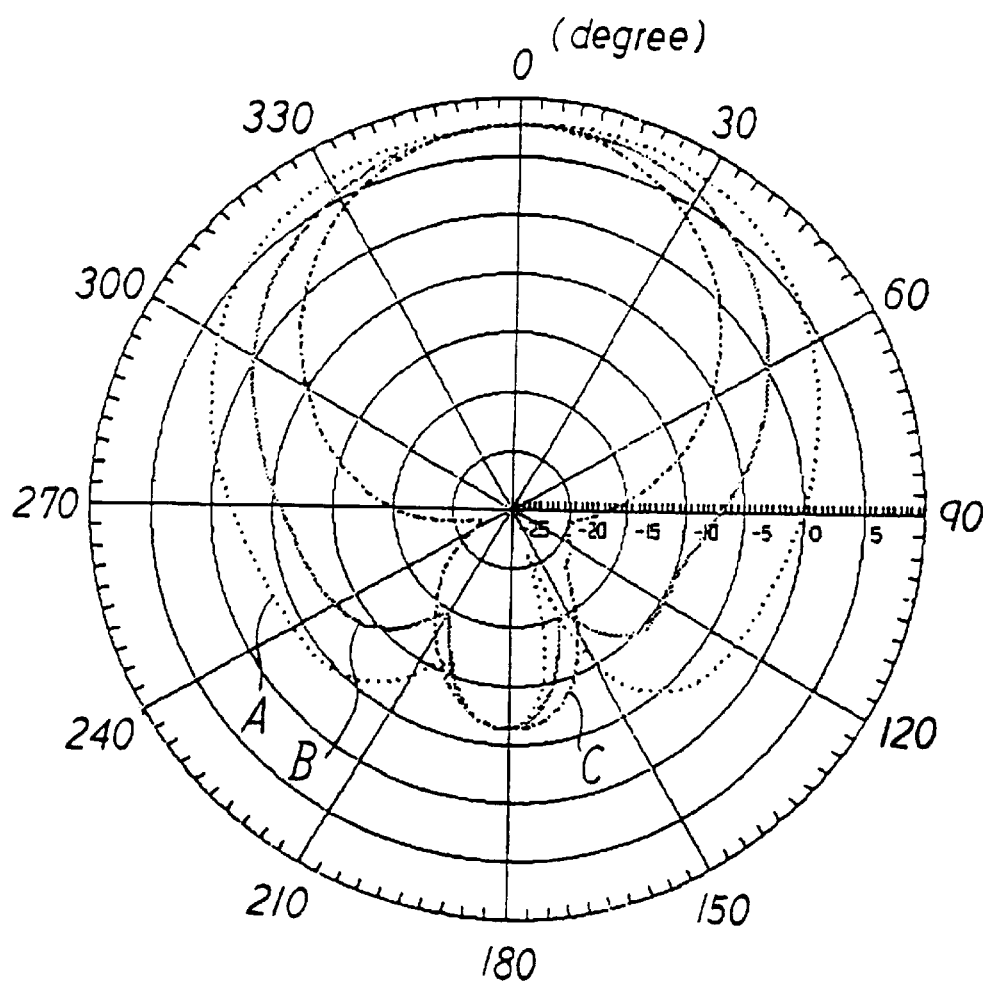
FIG. 24 is a chart showing radiation patterns of the laminated aperture antenna of the invention.

FIG. 24 is a chart showing a simulation result of radiation patterns of the laminated aperture antenna of the invention. In FIG. 24, the radial direction represents the intensity of radiated energy and the circumferential direction represents an angle (0° is the front direction of the antenna). The reference character (A) denotes the radiation pattern on the H-plane, (C) that on the E- plane and (B) that on the plane between the H- and E-planes. It is apparent from the result that a directional gain is 8 dBi. It can be said that the laminated aperture antenna of the invention has a higher gain more or less as compared to that of a patch antenna using dielectric whose relative dielectric constant is 5 is around 6 dBi.

Figure 25:
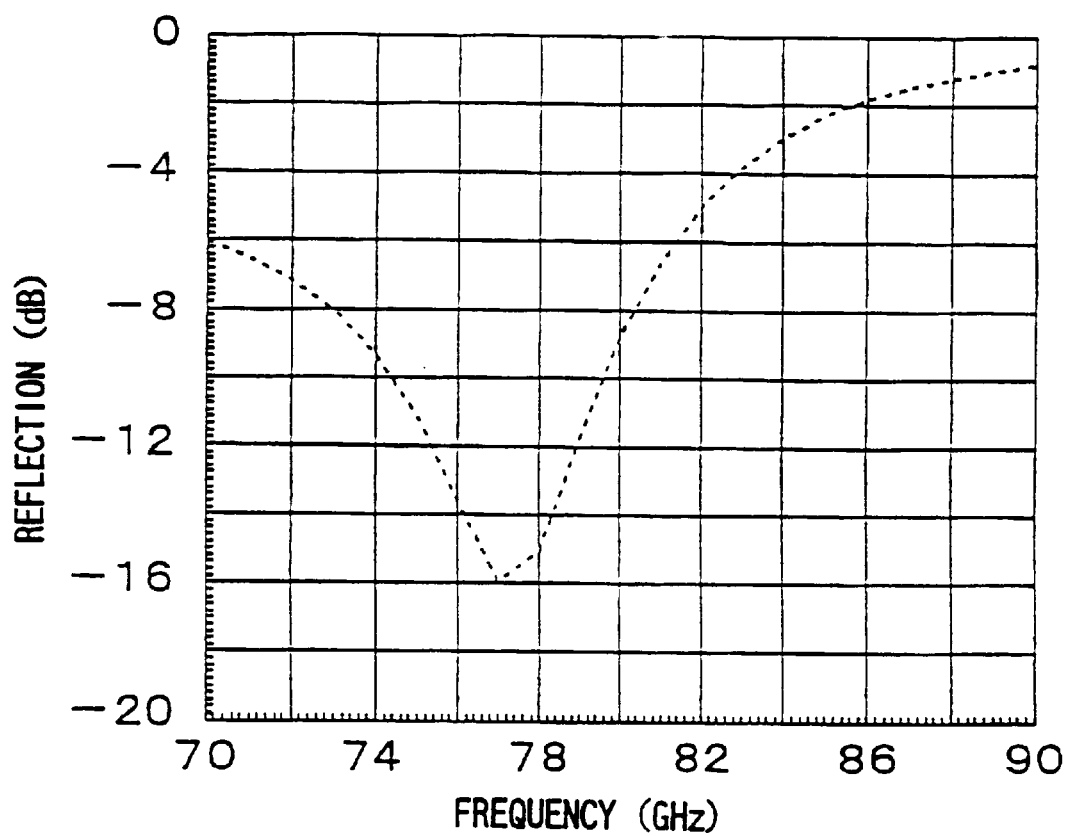
FIG. 25 is a chart showing a frequency characteristic of reflection of the laminated aperture antenna of the invention.

FIG. 25 is a chart showing a simulation result of a frequency characteristic of reflection of the laminated aperture antenna of the invention. The horizontal axis represents a frequency (GHz), the vertical axis represents an amount of reflection (dB) with respect to a high-frequency signal fed to the antenna and a dotted line represents the frequency characteristic curve of the reflection. It can be seen from FIG. 25 that when a frequency band of the antenna is a domain where VSWR (voltage standing wave ratio) is 2 or less, it is 5.7 GHz (7.3% with respect to the center frequency of 77 GHz) in this case and it is wide slightly as compared to the case of the patch antenna.

Figure 26:
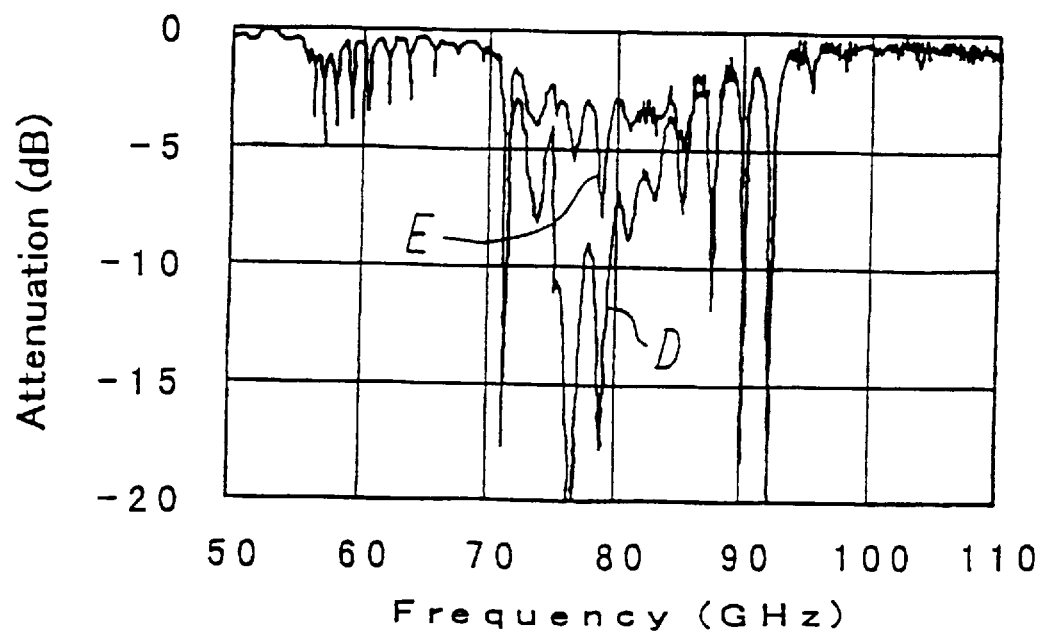
FIG. 26 is a chart showing a frequency characteristic of reflection of the laminated aperture antenna.

FIG. 26 is a chart showing a frequency characteristic of reflection of a laminated aperture antenna made in trial. The horizontal axis represents a frequency (GHz), the vertical axis represents reflection (dB) and a curve D represents the frequency characteristic of the reflection of the laminated aperture antenna. It is noted that a curve E shows the characteristic when the aperture of the antenna is covered by a metal for the purpose of reference. It can be seen from FIG. 26 that the laminated aperture antenna of the invention radiates electromagnetic wave favorably from the aperture from the fact that the reflection is large in the curve E around 77 GHz which is the center frequency as compared to the curve D.

When the same evaluation was conducted on the laminated aperture antennas of the invention in which the shape of the spatial resonator is columnar or in which the feed line is connected to the side face of the spatial resonator, it was confirmed that all of them have the favorable antenna characteristics.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An antenna comprising:
    a plurality of dielectric layers laminated to form a dielectric substrate;
    a main conductor layer formed on a surface of the dielectric substrate, the main conductor layer defining an aperture;
    a plurality of through conductors formed in a laminating direction in at least some of the dielectric layers;
    a plurality of sub-conductor layers formed between at least some of the adjacent dielectric layers to electrically connect the plurality of through conductors, the plurality of through conductors and sub-conductors forming an antenna conductor wall connected to the main conductor layer; and
    a feed line formed in the dielectric substrate and connected to the antenna conductor wall.

2. The antenna of claim 1, wherein at least part of the antenna conductor wall is formed so as to gradually expand laterally as it becomes closer to the surface of the substrate.

3. The antenna of claim 1, wherein a concave portion is formed in the substrate enclosed by the aperture.

4. The antenna of claim 3, wherein the concave portion is formed so as to gradually expand laterally as it becomes closer to the surface of the substrate.

5. The antenna of claim 1, wherein the through conductors in the dielectric layers are aligned with each other in the laminating direction.

6. The antenna of claim 1, wherein the through conductors in each dielectric layer are evenly spaced.

7. The antenna of claim 6, wherein the distance between adjacent through conductors in each dielectric layer is equal to or less than a half of the wavelength of a signal transmitted by the antenna.

8. The antenna of claim 1, wherein the feed line comprises:
- two overlapping feeding main conductor layers each formed between two adjacent laminated dielectric layers;
- a plurality of feeding through conductors formed in the laminating direction in each dielectric layer between the two feeding main conductor layers, the feeding through conductors forming two rows defining a feeding direction; and
- one or more feeding sub-conductor layers formed between adjacent dielectric layers between the two feeding main conductor layers to electrically connect the plurality of feeding through conductors, the feeding through conductors and the feeding sub-conductors forming a feeding conductor wall electrically connected to the two feeding main conductor layers to form the feed line.

9. The antenna of claim 8, wherein the feeding through conductors in each row are evenly spaced at a distance equal to or less than a half of the wavelength of a signal transmitted by the antenna.

10. The antenna of claim 1, comprising two feed lines connected to the antenna conductor wall, the two feed lines being at a right angle with respect to each other and feeding electromagnetic waves to the antenna at a phase difference of 90°.

11. The antenna of claim 1, wherein at lease some dielectric layers adjacent the surface of the substrate define a hollow portion of the substrate bound by the aperture of the main conductor layer, and wherein the main conductor layer extends to an inside surface of the hollow portion to form a conductor wall.

12. An antenna array comprising a plurality of antennas of claim 1 formed in the same dielectric substrate.

13. The antenna array of claim 12, wherein the feed lines of the antennas are connected to each other.

14. A wiring board comprising:
- an antenna of claim 1; and
- a high-frequency circuit connected to the feed line.

15. The wiring board of claim 14, wherein the dielectric substrate defines a hermetically sealed cavity and the high-frequency circuit is disposed within the cavity.

16. An antenna comprising:
- a plurality of dielectric layers laminated to form a dielectric substrate;
- an upper main conductor layer formed on an upper surface of the dielectric substrate, the main conductor layer defining an aperture;
- a lower main conductor layer formed below a dielectric layer and overlapping the aperture of the upper main conductor layer;
- a plurality of through conductors formed in the laminating direction around the aperture in the dielectric layers between the upper and lower main conductor layers; and
- a plurality of sub-conductor layer formed between adjacent dielectric layers between the upper and lower main conductors to electrically connect the plurality of through conductors, the plurality of through conductors and sub-conductors forming a conductor wall connected to the upper and lower main conductor layers, a space defined by the upper and lower main conductors and the conductor wall forming a spatial resonator.

17. The laminated aperture antenna of claim 16, wherein the aperture is rectangular and the space is rectangular parallelopiped.

18. The laminated aperture antenna of claim 16, wherein the aperture is circular and the space is columnar.

19. The laminated aperture antenna of claim 16, wherein a feeding slot is formed at a region of the lower main conductor layer facing to the space.

20. The antenna of claim 16, further comprising a feed line formed of a microstrip line or a coplanar line connected to a side face of the spatial resonator.

21. The antenna of claim 20, A wherein the aperture is a rectangle or ellipse in shape and the feed line is formed at a direction of 45° with respect to a side of the rectangle or to an axis of the ellipse.

22. The antenna of claim 16, wherein the lower main conductor layer defines two feeding slots located in an area overlapping the aperture, the two feeding slots being at a right angle with respect to each other and feeding electromagnetic waves to the antenna at a phase difference of 90°.

23. The antenna of claim 16, further comprising two feed lines each formed of a microstrip line or a coplanar line, the feed lines connected to a side face of the spatial resonator and disposed at a right angle with respect to each other, the feed lines feeding electromagnetic waves to the antenna at a phase difference of 90°.

24. An antenna array comprising a plurality of antennas of claim 16 formed in the same dielectric substrate.

25. A wiring board comprising:
- an antenna of claim 16;
- a feed line for feeding electromagnetic signal to the antenna; and
- a high-frequency-circuit connected to the feed line.

26. The wiring board of claim 25, further comprising a mounting section formed on the dielectric substrate for mounting a semiconductor element.

* * * * *